(12) United States Patent
Yamazaki et al.

(10) Patent No.: US 8,040,456 B2
(45) Date of Patent: Oct. 18, 2011

(54) LIQUID CRYSTAL DISPLAY DEVICE AND MANUFACTURING METHOD OF LIQUID CRYSTAL DISPLAY DEVICE

(75) Inventors: Shunpei Yamazaki, Tokyo (JP); Toru Takayama, Kanagawa (JP); Junya Maruyama, Kanagawa (JP); Yuugo Goto, Kanagawa (JP); Yumiko Ohno, Kanagawa (JP); Akio Endo, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/756,833

(22) Filed: Jan. 14, 2004

(65) Prior Publication Data

US 2004/0169786 A1    Sep. 2, 2004

(30) Foreign Application Priority Data

Jan. 15, 2003  (JP) .................................. 2003-007568
Jan. 15, 2003  (JP) .................................. 2003-007697

(51) Int. Cl.
 *G02F 1/1335* (2006.01)
(52) U.S. Cl. .................. 349/61; 349/62; 349/63; 349/12
(58) Field of Classification Search ................ 349/61–68
See application file for complete search history.

(56) References Cited

U.S. PATENT DOCUMENTS

| | | | |
|---|---|---|---|
| 4,090,219 A | 5/1978 | Ernstoff et al. | |
| 4,202,607 A * | 5/1980 | Washizuka et al. | 349/113 |
| 4,536,014 A * | 8/1985 | Boutaleb et al. | 283/83 |
| 4,648,691 A * | 3/1987 | Oguchi et al. | 349/162 |
| 4,750,813 A | 6/1988 | Ohwada et al. | |
| 4,907,862 A | 3/1990 | Suntola | |
| 5,298,768 A * | 3/1994 | Okazaki et al. | 257/81 |
| 5,327,229 A | 7/1994 | Konno et al. | |
| 5,428,366 A | 6/1995 | Eichenlaub | |
| 5,439,837 A | 8/1995 | Hata et al. | |
| 5,528,262 A | 6/1996 | McDowall et al. | |
| 5,594,569 A | 1/1997 | Konuma et al. | |

(Continued)

FOREIGN PATENT DOCUMENTS

EP  0662773  7/1995

(Continued)

OTHER PUBLICATIONS

European Search Report dated Dec. 2, 2004 for EP 04 00 0515.
*Realization of a Display that is Thin, Light and Unbreakable*, Nikkei Microdevices, July Issue, 2002, pp. 71-72.

(Continued)

*Primary Examiner* — Lucy Chien
(74) *Attorney, Agent, or Firm* — Eric J. Robinson; Robinson Intellectual Property Law Office, P.C.

(57) ABSTRACT

To sophisticate a portable electronic appliance without hindering reduction of the weight and the size, more specifically, to sophisticate a liquid crystal display apparatus installed in a portable electronic appliance without hindering the mechanical strength, a liquid crystal display apparatus includes a first plastic substrate, a light-emitting device which is disposed over the first plastic substrate, resin which covers the light-emitting device, an insulating film which is in contact with the resin, a semiconductor device which is in contact with the insulating film, a liquid crystal cell which is electrically connected to the semiconductor device, and a second plastic substrate, wherein the semiconductor device and the liquid crystal cell are disposed between the first plastic substrate and the second plastic substrate.

19 Claims, 21 Drawing Sheets

U.S. PATENT DOCUMENTS

| | | |
|---|---|---|
| 5,642,129 A | 6/1997 | Zavracky et al. |
| 5,643,826 A | 7/1997 | Ohtani et al. |
| 5,648,277 A | 7/1997 | Zhang et al. |
| 5,781,263 A * | 7/1998 | Kawagoe et al. ............. 349/135 |
| 5,834,327 A | 11/1998 | Yamazaki et al. |
| 5,923,962 A | 7/1999 | Ohtani et al. |
| 5,998,925 A | 12/1999 | Shimizu et al. |
| 6,007,209 A | 12/1999 | Pelka |
| 6,066,861 A | 5/2000 | Hoehn et al. |
| 6,069,440 A | 5/2000 | Shimizu et al. |
| 6,078,304 A | 6/2000 | Miyazawa |
| 6,108,058 A | 8/2000 | Uchida |
| 6,127,199 A | 10/2000 | Inoue et al. |
| 6,151,004 A | 11/2000 | Kaneko |
| 6,188,379 B1 | 2/2001 | Kaneko |
| 6,218,678 B1 | 4/2001 | Zhang et al. |
| 6,245,259 B1 | 6/2001 | Hoehn et al. |
| 6,277,301 B1 | 8/2001 | Hoehn et al. |
| 6,285,042 B1 | 9/2001 | Ohtani et al. |
| 6,285,426 B1 * | 9/2001 | Akins et al. ............. 349/114 |
| 6,300,927 B1 | 10/2001 | Kubota et al. |
| 6,320,568 B1 | 11/2001 | Zavracky |
| 6,331,381 B1 * | 12/2001 | Chaudhari et al. ............. 430/320 |
| 6,335,541 B1 | 1/2002 | Ohtani et al. |
| 6,372,608 B1 | 4/2002 | Shimoda et al. |
| 6,417,899 B1 * | 7/2002 | Jones et al. ............. 349/96 |
| 6,475,839 B2 | 11/2002 | Zhang et al. |
| 6,542,137 B2 | 4/2003 | Kimura et al. |
| 6,542,145 B1 | 4/2003 | Reisinger et al. |
| 6,576,930 B2 | 6/2003 | Reeh et al. |
| 6,592,780 B2 | 7/2003 | Hoehn et al. |
| 6,608,332 B2 | 8/2003 | Shimizu et al. |
| 6,613,247 B1 | 9/2003 | Hoehn et al. |
| 6,614,179 B1 | 9/2003 | Shimizu et al. |
| 6,617,612 B2 | 9/2003 | Zhang et al. |
| 6,747,801 B2 | 6/2004 | Umemoto et al. |
| 6,768,529 B2 | 7/2004 | Umemoto et al. |
| 6,781,152 B2 | 8/2004 | Yamazaki |
| 6,784,034 B1 | 8/2004 | Choi |
| 6,809,347 B2 | 10/2004 | Ota et al. |
| 6,812,500 B2 | 11/2004 | Reeh et al. |
| 6,849,877 B2 | 2/2005 | Yamazaki et al. |
| 6,891,334 B2 * | 5/2005 | Yamamoto et al. ........ 315/169.1 |
| 6,894,745 B2 | 5/2005 | Fujimori et al. |
| 6,917,473 B2 | 7/2005 | Umemoto et al. |
| 6,975,369 B1 | 12/2005 | Burkholder |
| 6,998,639 B2 | 2/2006 | Ohtani et al. |
| 7,026,756 B2 | 4/2006 | Shimizu et al. |
| 7,060,153 B2 | 6/2006 | Yamazaki et al. |
| 7,071,616 B2 | 7/2006 | Shimizu et al. |
| 7,078,732 B1 | 7/2006 | Reeh et al. |
| 7,119,364 B2 | 10/2006 | Yamazaki |
| 7,126,162 B2 | 10/2006 | Reeh et al. |
| 7,126,274 B2 | 10/2006 | Shimizu et al. |
| 7,138,660 B2 | 11/2006 | Ota et al. |
| 7,151,283 B2 | 12/2006 | Reeh et al. |
| 7,187,011 B2 | 3/2007 | Ota et al. |
| 7,215,074 B2 | 5/2007 | Shimizu et al. |
| 7,227,685 B2 | 6/2007 | Umemoto et al. |
| 7,235,189 B2 | 6/2007 | Hoehn et al. |
| 7,256,856 B2 | 8/2007 | Imaeda |
| 7,259,396 B2 | 8/2007 | Ota et al. |
| 7,262,754 B1 | 8/2007 | Yamazaki |
| 7,276,736 B2 | 10/2007 | Hoehn et al. |
| 7,329,988 B2 | 2/2008 | Shimizu et al. |
| 7,345,317 B2 | 3/2008 | Reeh et al. |
| 7,362,048 B2 | 4/2008 | Shimizu et al. |
| 7,531,960 B2 | 5/2009 | Shimizu et al. |
| 7,629,621 B2 | 12/2009 | Reeh et al. |
| 7,682,848 B2 | 3/2010 | Shimizu et al. |
| 7,709,852 B2 | 5/2010 | Hoehn et al. |
| 2001/0000439 A1 * | 4/2001 | Ohta et al. ............. 349/141 |
| 2001/0012089 A1 * | 8/2001 | Shiraishi ............. 349/153 |
| 2001/0040645 A1 * | 11/2001 | Yamazaki ............. 349/42 |
| 2002/0030189 A1 | 3/2002 | Ishikawa |
| 2002/0030996 A1 | 3/2002 | Sakakibara |
| 2002/0033917 A1 * | 3/2002 | Hoshino ............. 349/113 |
| 2002/0041348 A1 * | 4/2002 | Yokoyama et al. ............. 349/61 |
| 2002/0085143 A1 * | 7/2002 | Kim et al. ............. 349/61 |
| 2002/0130985 A1 * | 9/2002 | Weindorf et al. ............. 349/61 |
| 2002/0146893 A1 | 10/2002 | Shimoda et al. |
| 2003/0034497 A1 | 2/2003 | Yamazaki et al. |
| 2004/0129450 A1 | 7/2004 | Yamazaki et al. |
| 2004/0132265 A1 | 7/2004 | Maruyama et al. |
| 2005/0068468 A1 | 3/2005 | Yamazaki et al. |
| 2005/0070196 A1 * | 3/2005 | Colombo et al. ............. 445/25 |
| 2006/0131583 A1 | 6/2006 | Ohtani et al. |
| 2006/0207714 A1 | 9/2006 | Yamazaki et al. |
| 2007/0082430 A1 | 4/2007 | Yamazaki |

FOREIGN PATENT DOCUMENTS

| | | |
|---|---|---|
| EP | 0709823 | 5/1996 |
| EP | 0762370 | 3/1997 |
| EP | 0827129 | 3/1998 |
| EP | 0 858 110 | 8/1998 |
| EP | 1 122 794 | 8/2001 |
| EP | 1 434 263 | 6/2004 |
| EP | 1 437 683 | 7/2004 |
| EP | 2261978 A | 12/2010 |
| JP | 62-016989 A | 1/1987 |
| JP | 06-027449 A | 2/1994 |
| JP | 07-130652 | 5/1995 |
| JP | 07-135318 | 5/1995 |
| JP | 07-191311 A | 7/1995 |
| JP | 08-078329 | 3/1996 |
| JP | 10-125929 | 5/1998 |
| JP | 10-125930 | 5/1998 |
| JP | 2001-144333 A | 5/2001 |
| JP | 2001-166300 | 6/2001 |
| JP | 2001-166300 A | 6/2001 |
| JP | 2001-272923 A | 10/2001 |
| JP | 2002-042525 A | 2/2002 |
| JP | 2002-072242 A | 3/2002 |
| KR | 1998-0018024 A | 6/1998 |
| KR | 1999-0015101 A | 3/1999 |
| KR | 2000-0022539 A | 4/2000 |
| KR | 2001-0003840 A | 1/2001 |
| KR | 2001-0062771 A | 7/2001 |
| KR | 2001-0076263 A | 8/2001 |
| KR | 2001-0076336 A | 8/2001 |
| KR | 2001-0099573 A | 11/2001 |
| KR | 2002-097028 | 12/2002 |
| KR | 2003-0031043 A | 4/2003 |
| KR | 2003-0031061 A | 4/2003 |
| KR | 2003-0091951 A | 12/2003 |
| KR | 2003-0097577 A | 12/2003 |
| KR | 2003-0097578 A | 12/2003 |
| KR | 2003-0097609 A | 12/2003 |
| TW | 494447 | 7/2002 |
| WO | WO-98/08213 | 2/1998 |

OTHER PUBLICATIONS

Office Action (Application No. 200410001866.0) dated Jun. 8, 2007.
Yoshida.T et al., "33.2: A Full-Color Thresholdless Antiferroelectric LCD Exhibiting Wide Viewing Angle With Fast Response Time ,", SID Digest '97 : SID International Symposium Digest of Technical Papers, 1997, pp. 841-844.
Furue.H et al., "P-78: Characteristics and Driving Scheme of Polymer-Stabilized Monostable FLCD Exhibiting Fast Response Time and High Contrast Ratio With Gray-Scale Capability,", SID Digest '98 : SID International Symposium Digest of Technical Papers, 1998, pp. 782-785.
Inui.S et al., "Thresholdless Antiferroelectricity in Liquid Crystals and Its Application to Displays,", J. Mater. Chem. (Journal of Materials Chemistry), 1996, vol. 6, No. 4, pp. 671-673.
Yoshihara.T, "Time Divided Full Color LCD by FLC,", Ekisho, Jul. 25, 1999, vol. 3, No. 3, pp. 190-194.
Terada.M et al., "Half V-Shaped Switching Mode FLCD,", Proceedings of 46th Spring Meetings of the Society for Applied Physics of Japan, Mar. 1, 1999, vol. 28P-V-8, p. 1316.
Korean Office Action (Application No. 2004-0002533) Dated Jul. 29, 2010.
Korean Office Action (Application No. 2010-0091393) Dated Oct. 26, 2010.
Taiwanese Office Action (Application No. 93100264) Dated Apr. 14, 2011.

* cited by examiner

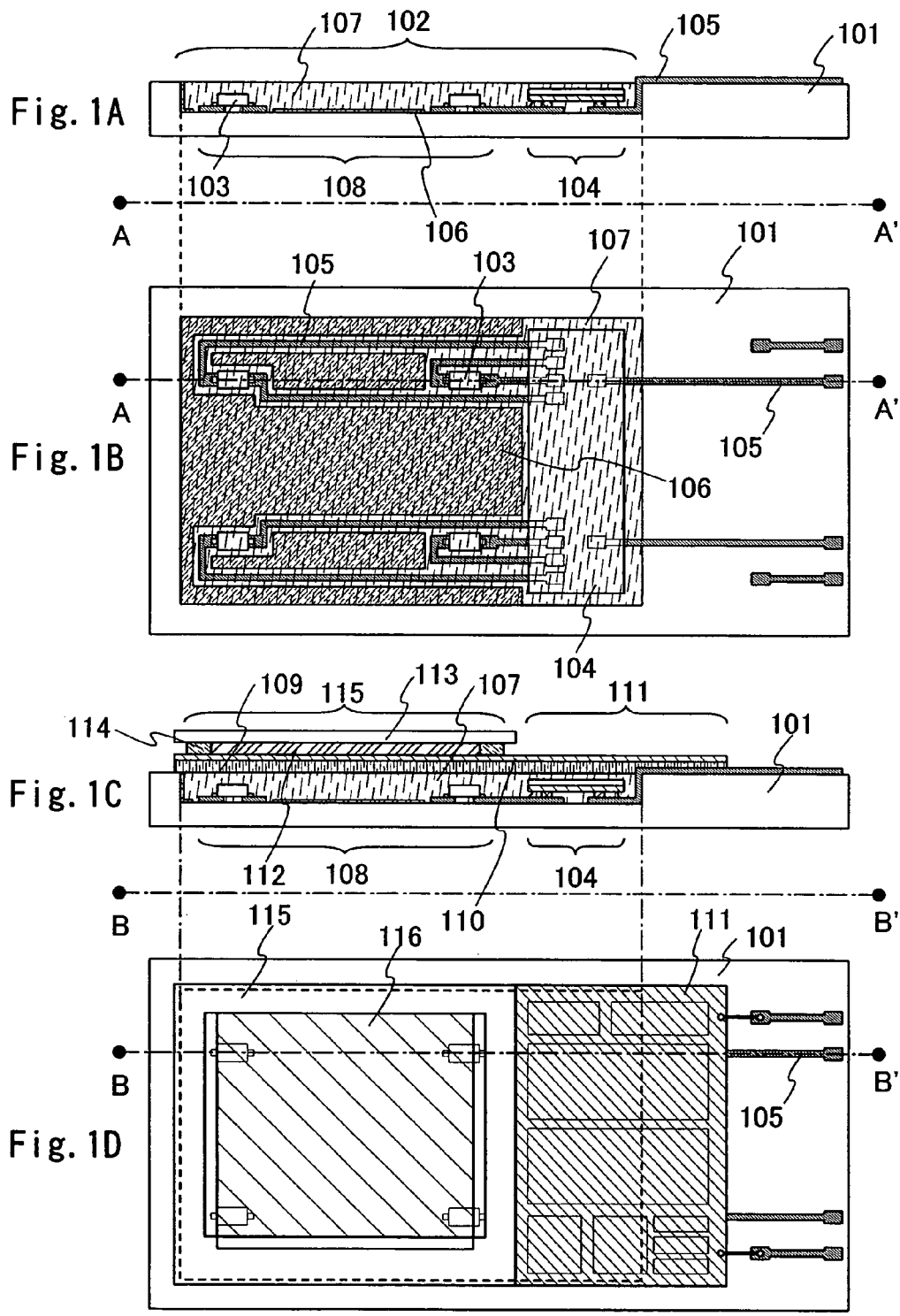

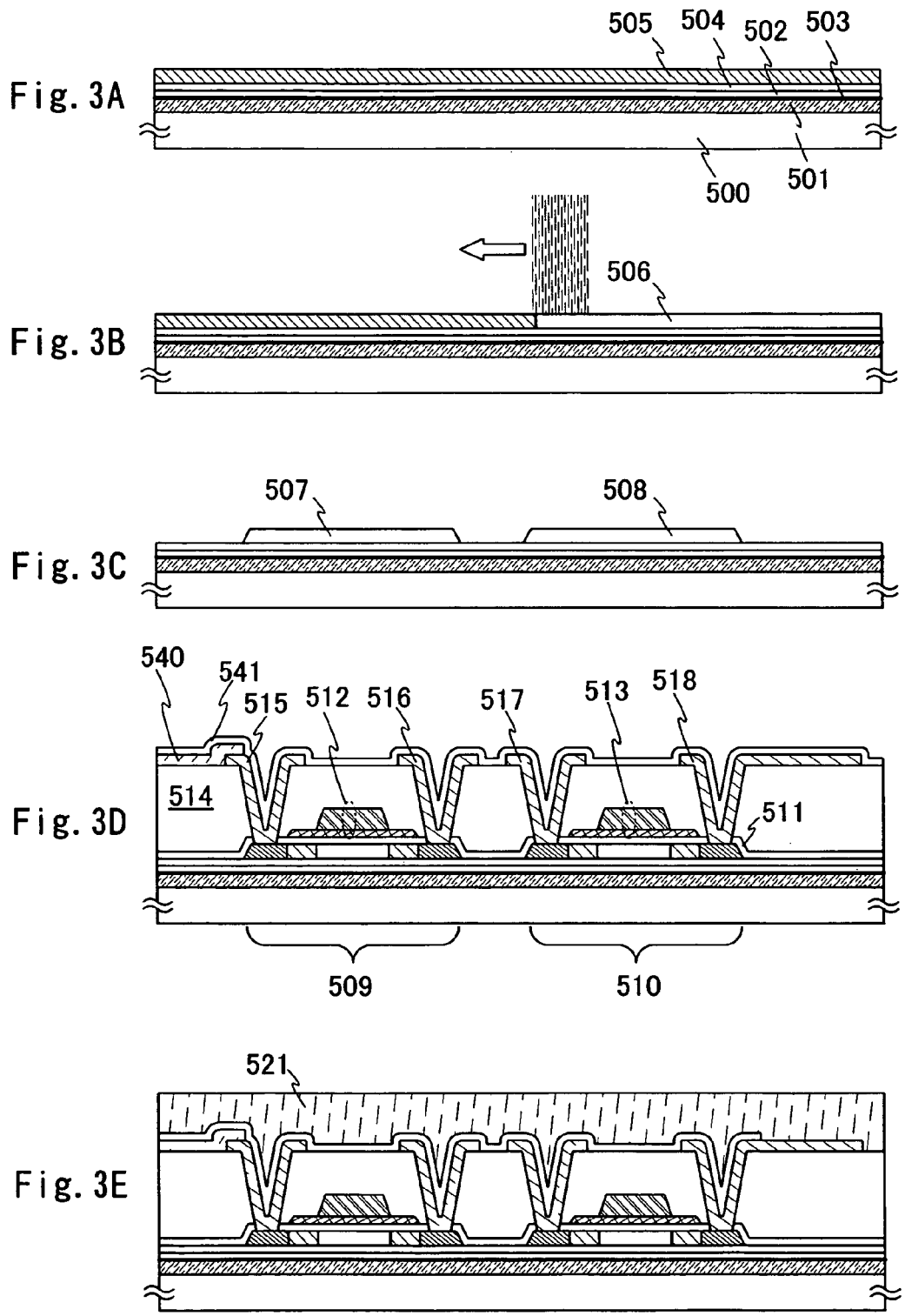

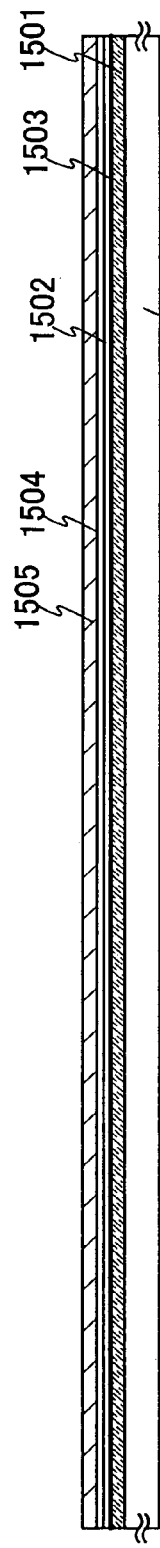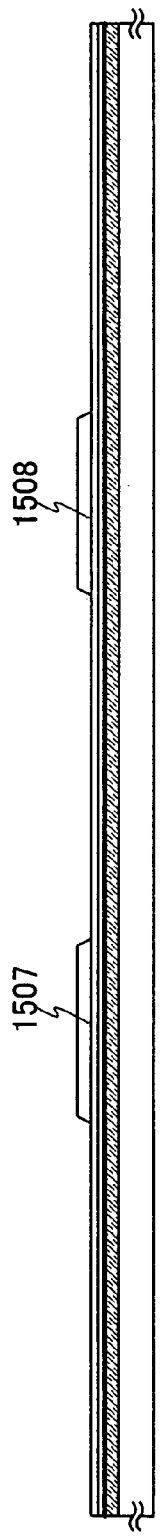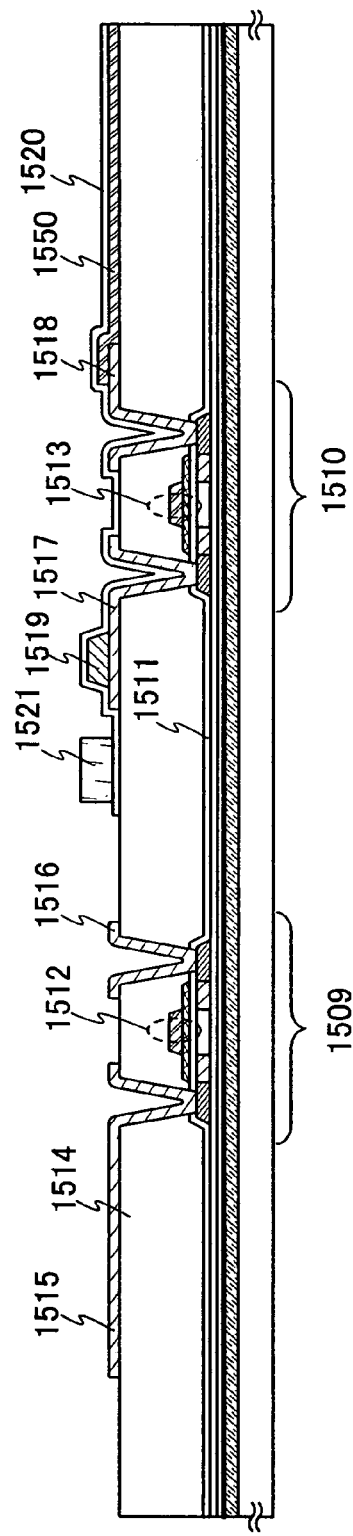

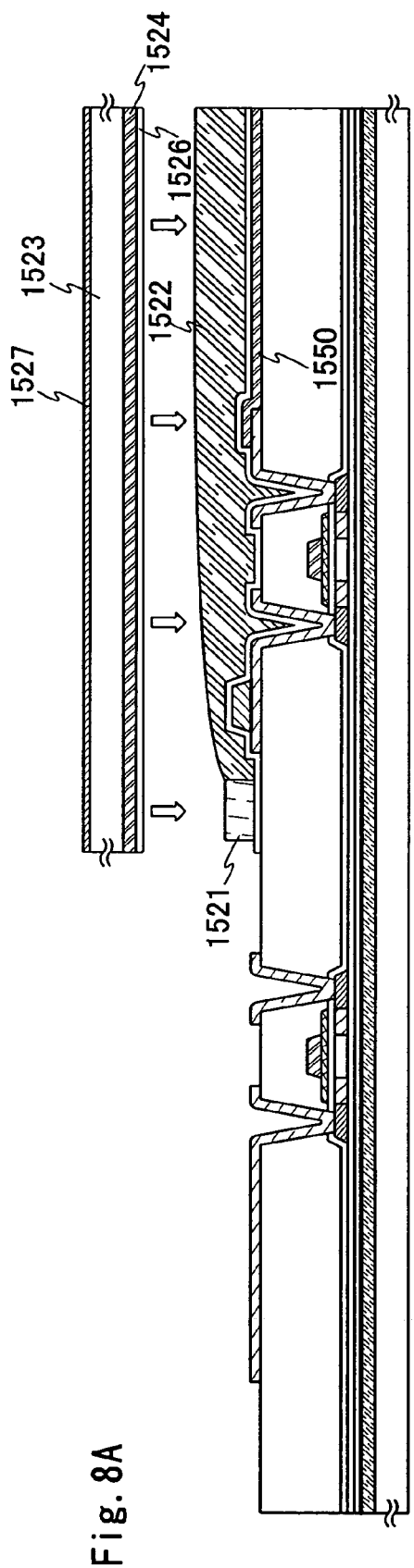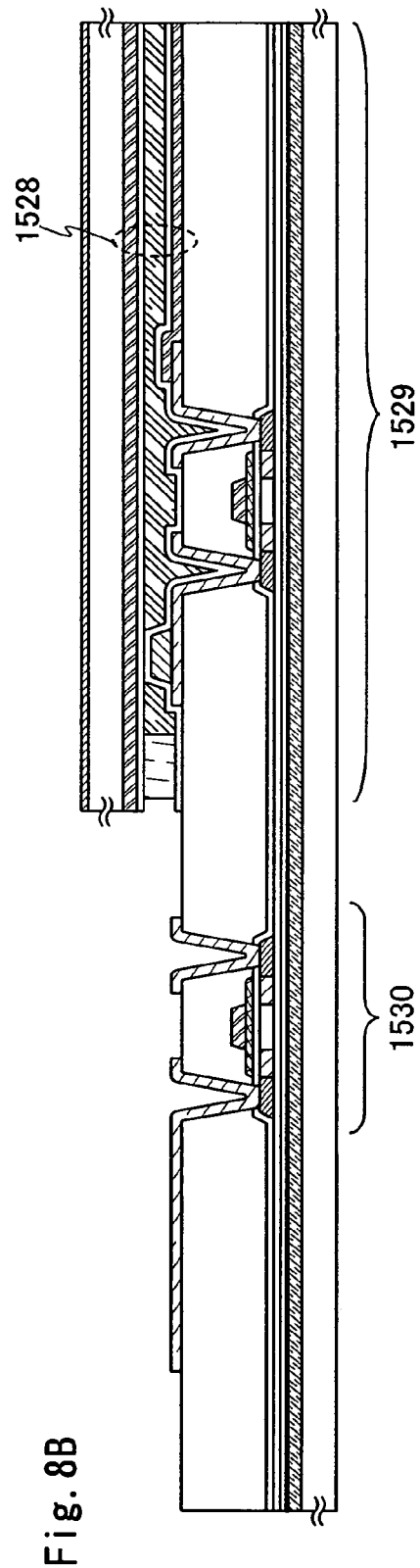

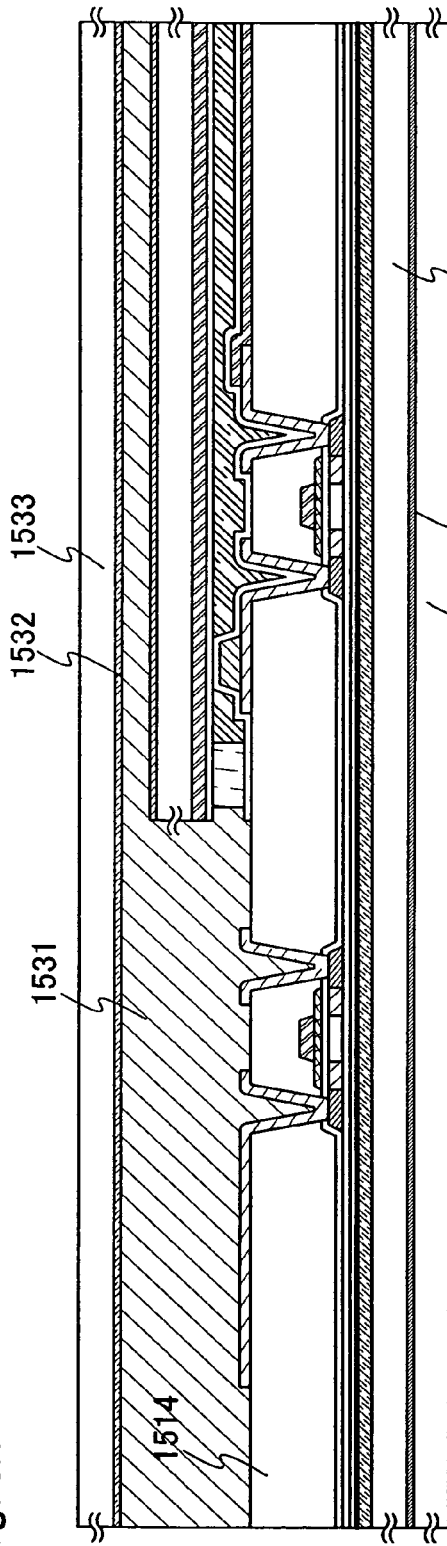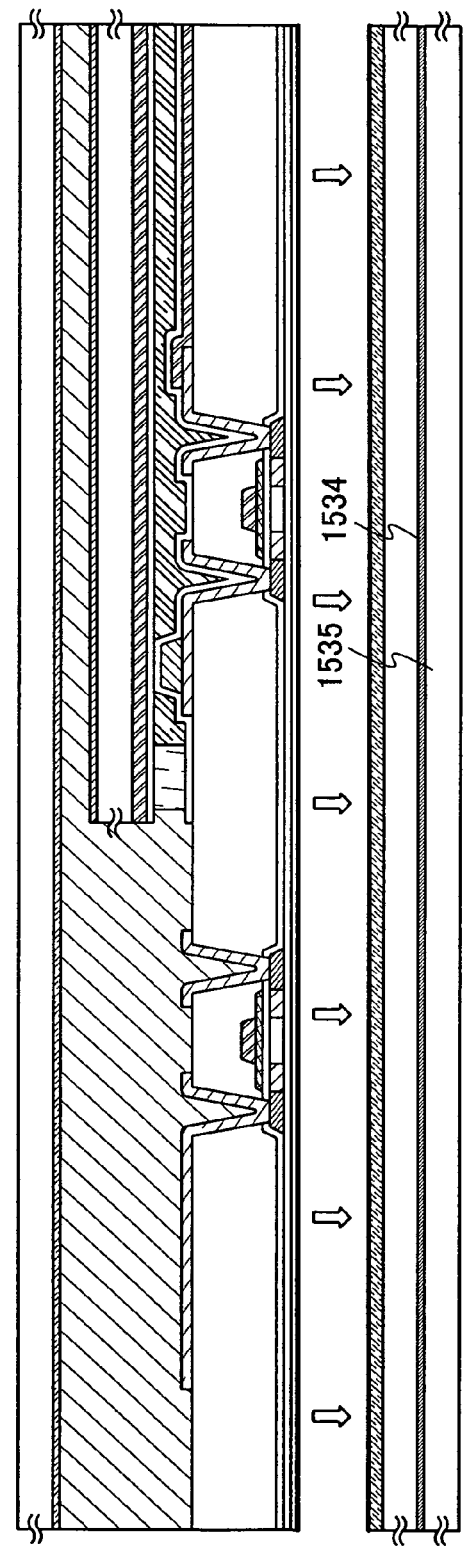
Fig. 9A
Fig. 9B

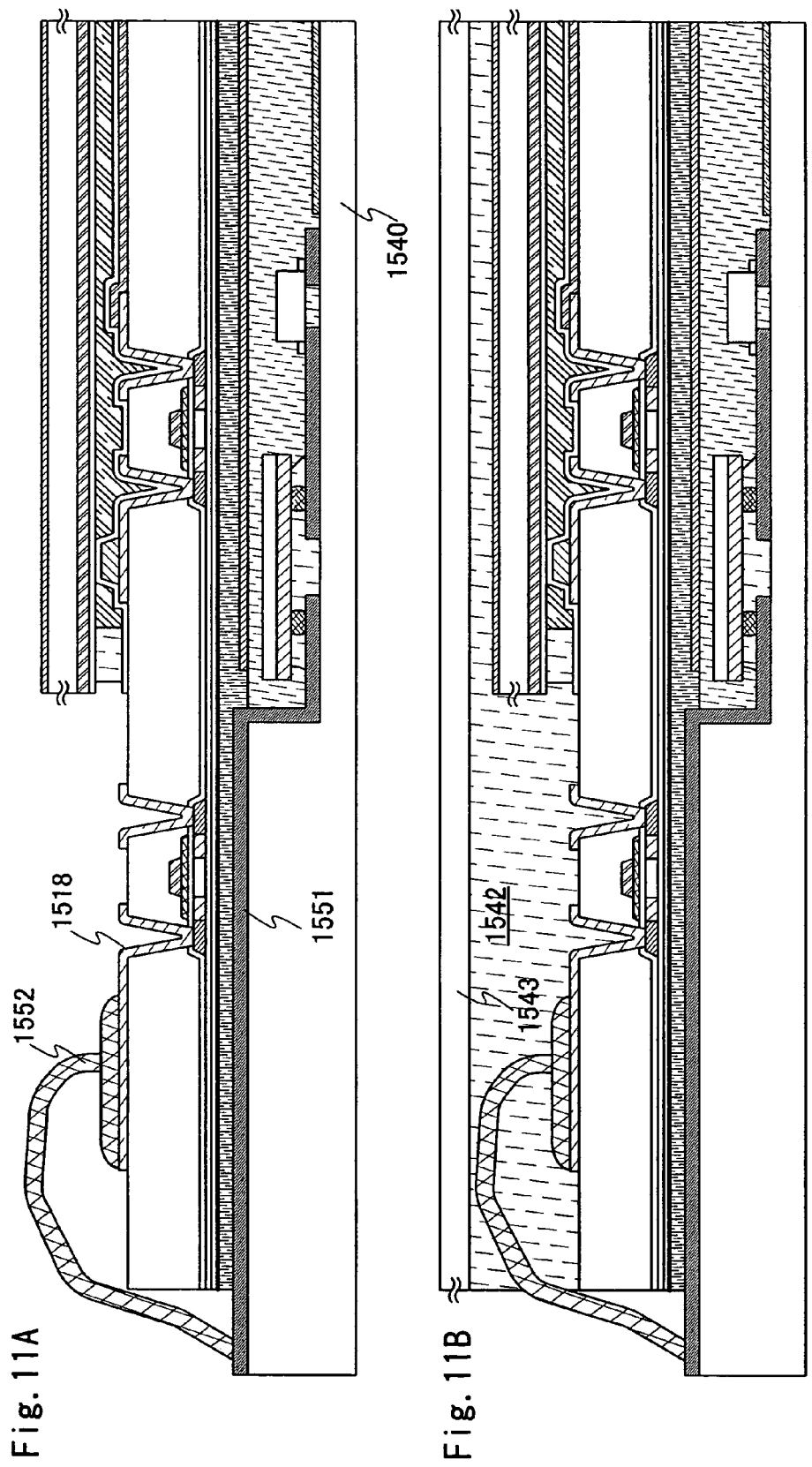

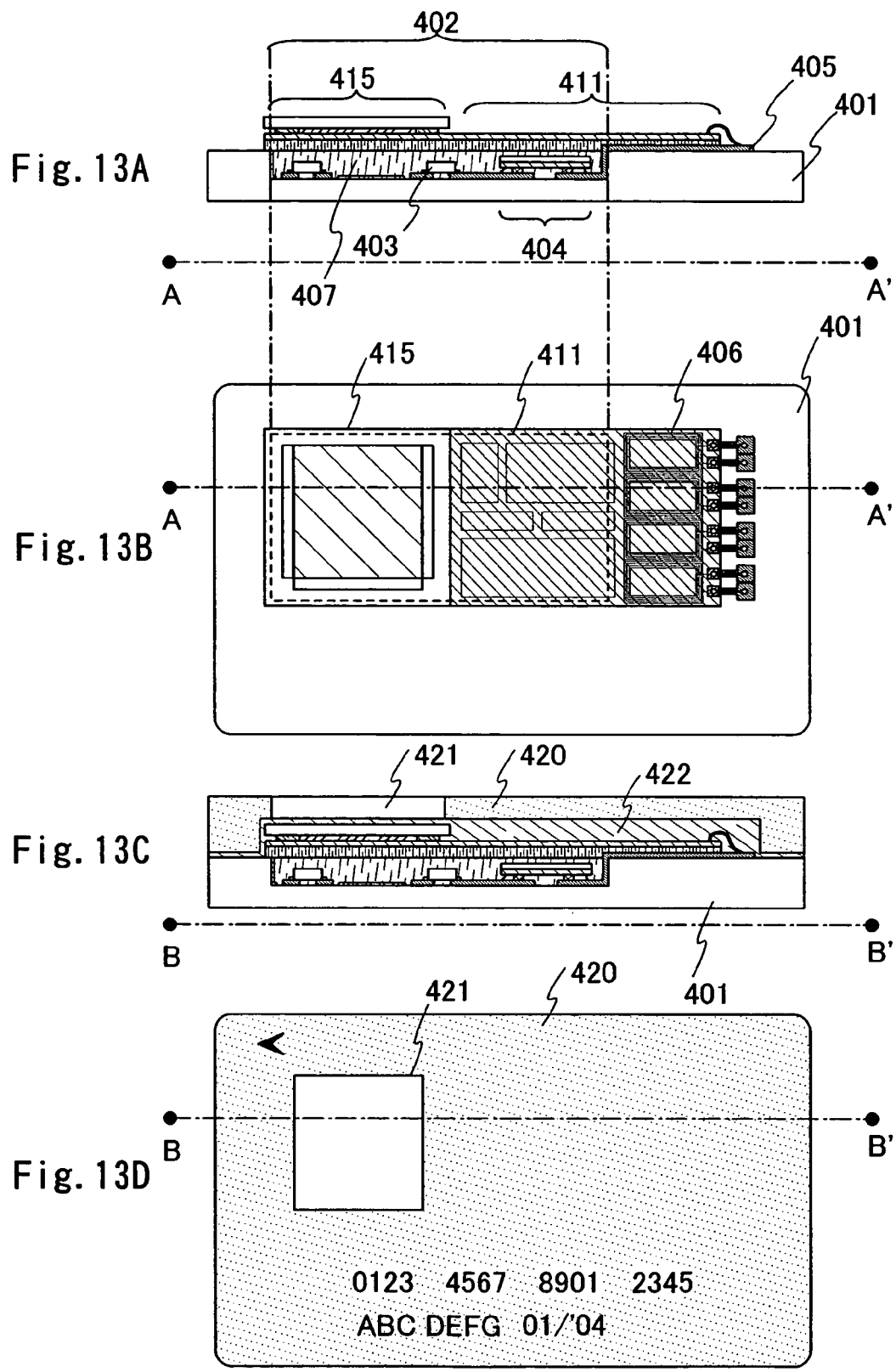

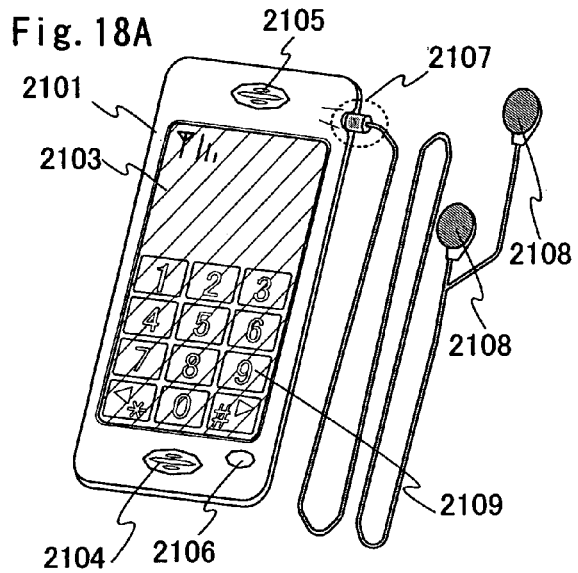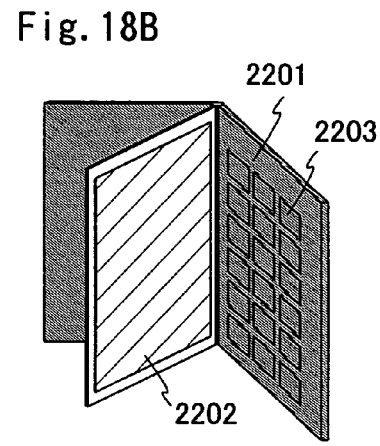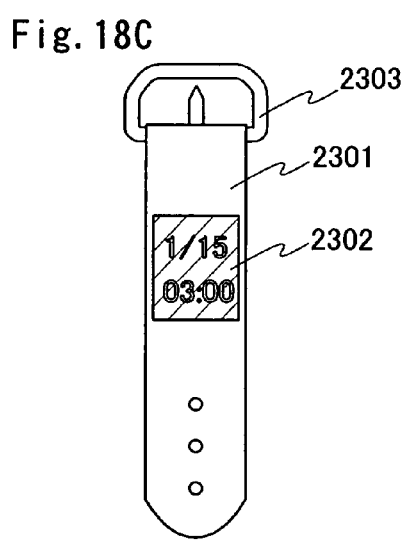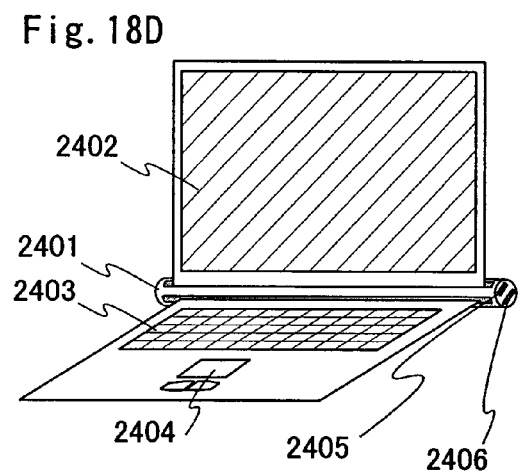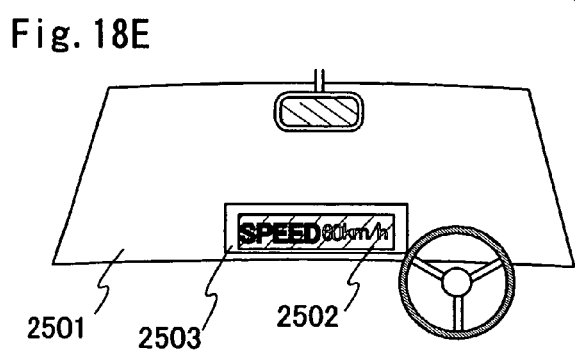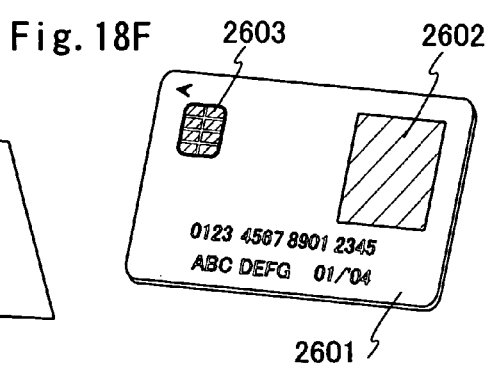

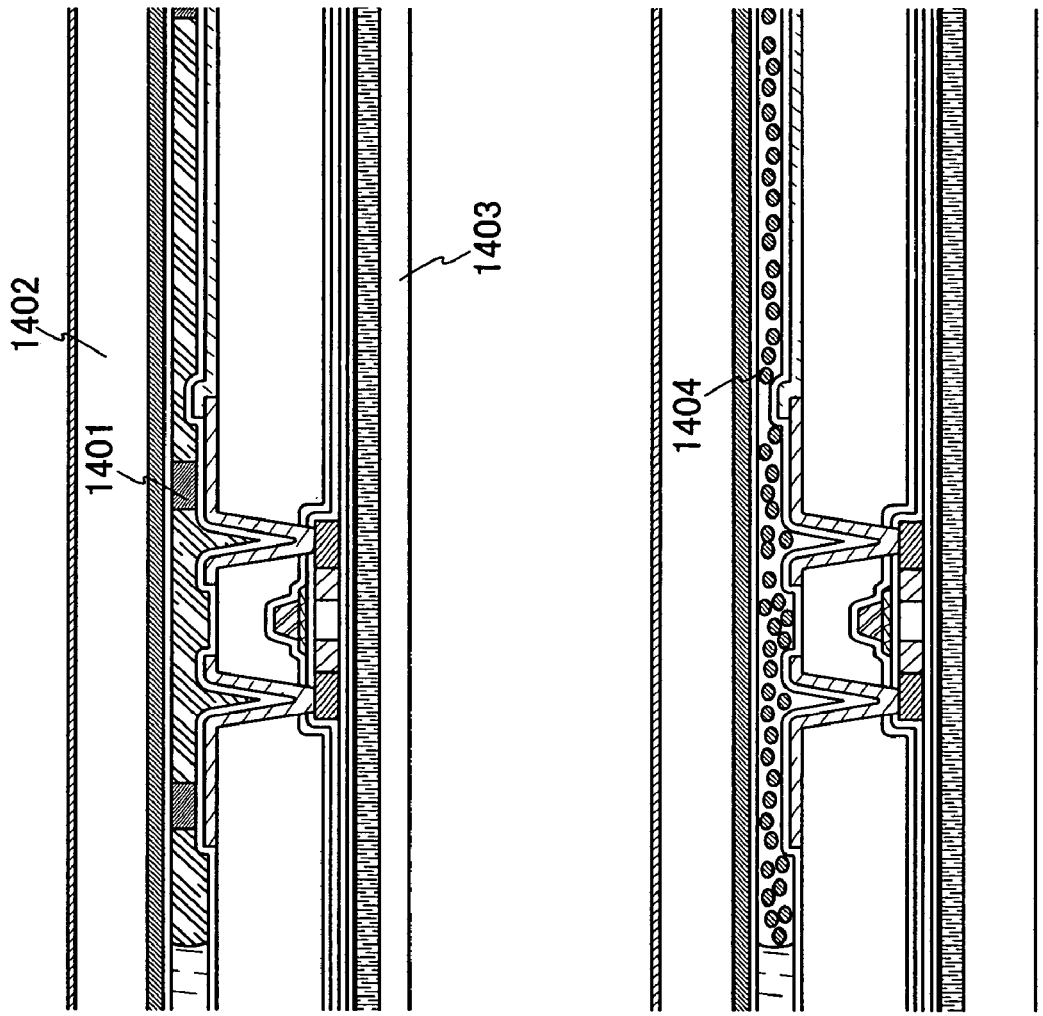

LIQUID CRYSTAL DISPLAY DEVICE AND MANUFACTURING METHOD OF LIQUID CRYSTAL DISPLAY DEVICE

BACKGROUND OF THE INVENTION

1. Field of the Invention

The present invention relates to a liquid crystal display apparatus, and more particularly such a transparent liquid crystal display apparatus installed in a portable electronic appliance. Further, the invention relates to a method for manufacturing a liquid crystal display apparatus, and more particularly such a method for manufacturing a transparent liquid crystal display apparatus installed in a portable electronic appliance. Moreover, the invention relates to an electronic appliance using the liquid crystal display apparatus.

2. Related Art

A portable electronic appliance as typified by a portable phone or an electronic book is required to have various functions such as sending and receiving mail, recognizing sound, and capturing an image using a small camera, in addition to a flat panel display for displaying an image. On the other hand, there is still a strong demand by user such as reducing size and weight. Therefore there is a need for installing IC having further large size of circuit or amount of memory as much as possible into limited volume of a portable electronic appliance.

It is important how to manufacture a flat panel display into thin and light in order to keep space to accommodate IC and to reduce size and weight of a portable electronic appliance. For instance, a liquid crystal display apparatus used relatively a lot for a portable electronic appliance can be in some degree reduced its size and weight by reducing a thickness of a glass substrate used for a panel filled with liquid crystal and by adopting a reflective type liquid crystal display apparatus that needs no light source, an optical waveguide, or the like.

However, a glass substrate cannot be formed into too thin considering mechanical strength of a panel. For instance, in case of using barium borosilicate glass, alumino borosilicate glass, or the like, thickness limit and weight limit of 3-inch-square is at most from 1 to 2 mm and 10 g, respectively. A reflective type liquid crystal display apparatus utilizing outside light is difficult in recognition of an image in the dark so that an advantage that a portable electronic appliance is not required to be site-specific is not sufficiently utilized.

SUMMARY OF THE INVENTION

It is an object of the present invention is to sophisticate a portable electronic appliance without hindering reduction of the weight and the size. It is more specific object of the invention is to sophisticate a liquid crystal display apparatus installed in a portable electronic appliance without hindering the mechanical strength.

A liquid crystal display apparatus according to the invention uses a light-emitting device such as a light-emitting diode (LED) or an electroluminescent device as a light source. The light-emitting device formed over a plastic substrate having flexibility is covered with a resin that is transparent to light in order to flatten a surface of the light-emitting device. Then, a liquid crystal cell and a semiconductor device for driving the liquid crystal cell are provided over the flattened resin. A light source in a state that a light-emitting device is covered with a resin is referred to as a solid-state light source.

Generally, a plastic substrate is superior in mechanical strength for vibration and shock by its flexibility so that the thickness can easily be reduced. However, a plastic substrate and a resin often have not enough heat resistance to withstand heat treatment in manufacturing a semiconductor device used for a liquid crystal display apparatus. In view of this, according to the invention, a semiconductor device is formed over a substrate having resistance enough to withstand the heat treatment, and the semiconductor device is moved over a solid-state light source.

A liquid crystal display apparatus according to the invention is provided with a means of reflecting light generated in a light-emitting device in a direction of a liquid crystal cell. Specifically, light is reflected by pasting a ready-made reflection plate over the plastic substrate or by depositing a metal film (hereinafter, reflection film) over a surface of the plastic substrate by vapor deposition. Further, a polarization plate is provided between a resin covering a light-emitting device, and a semiconductor device and liquid crystal cell.

Hereinafter, the first method for manufacturing a liquid crystal display apparatus according to the invention will be explained in specific.

A first substrate that has heat resistance capable of withstanding heat treatment in a process for manufacturing a semiconductor device is prepared. A metal film is formed over the first substrate, and oxidized to form a metal oxide film having an extreme thin film thickness of several nm. Then, an insulating film and a semiconductor film are sequentially stacked over the metal oxide film. The insulating film can be formed into either a single layer or a laminated layer composed of a plurality of films. For instance, silicon nitride, silicon oxynitride, silicon oxide, or the like can be used for the insulating film. A semiconductor device used for a liquid crystal display apparatus is formed by the semiconductor film.

After the semiconductor device is formed and before completing a liquid crystal cell, a second substrate is pasted onto the first substrate to cover the semiconductor device in such a way that the semiconductor device is sandwiched between the second substrate and the first substrate. The liquid crystal cell includes a pixel electrode, a counter electrode, and liquid crystal disposed between the pixel electrode and the counter electrode. As used herein, the term "before completing a liquid crystal cell" refers to a period between the formation of a pixel electrode of a liquid crystal cell connected electrically to a TFT, which is one of semiconductor devices, and an orientation film covering the pixel electrode, and the paste of a counter substrate provided with a counter electrode.

A third substrate is pasted for reinforcing rigidity of the first substrate onto an opposite side of the first substrate on which the semiconductor device is formed. The first substrate can be easily separated and the semiconductor device is hardly damaged when rigidity of the first substrate is stronger than that of the second substrate. In addition, the third substrate is unnecessary to be pasted in case that rigidity of the first substrate is enough to separate the first substrate from the semiconductor device.

Then, the metal oxide film is crystallized by heat treatment or the like to enhance brittleness of the metal oxide film and to make it easier for the first substrate to be easily separated from the semiconductor device. Subsequently, the first substrate is separated together with the third substrate from the semiconductor device. In addition, the heat treatment to crystallize the first substrate can be carried out before pasting either the third substrate or the second substrate. Alternatively, the heat treatment in a process for forming the semiconductor device can serve as the heat treatment to crystallize the metal oxide film.

The first substrate may be separated together with the third substrate from the semiconductor device by splitting-off a boundary face of the metal film and the metal oxide film, the boundary face of the insulating film and the metal oxide film, or metal oxide film itself. In any case, the first substrate is separated so as the semiconductor device to attach to the second substrate.

A plastic substrate at the side of a light source is prepared for being pasted with a semiconductor device. Hereinafter, the plastic substrate is referred to as a device substrate to distinguish from a plastic substrate at the side of a counter electrode used in later. A light-emitting device is provided over the device substrate, and a resin is coated to cover the light-emitting device. Then, a first polarization plate is pasted onto the resin that is flattened.

Next, by separating the first substrate, the semiconductor device attached to the second substrate is pasted onto the first polarization plate with adhesive or the like. Then, the second substrate is separated to fix the semiconductor device to the device substrate.

A liquid crystal cell for a liquid crystal apparatus is formed. Specifically, a plastic substrate provided with a counter electrode, a second polarization substrate, or the like (hereinafter, counter substrate) is prepared separately, and pasted onto the semiconductor device, then, a liquid crystal cell is completed. A color filter, an orientation film, a black matrix, and the like may be provided to the counter substrate in addition to the counter electrode and the second polarization plate.

Hereinafter, a second method for manufacturing a liquid crystal display apparatus according to the invention will be explained.

A first substrate that has heat resistance capable of withstanding heat treatment in a process for manufacturing a semiconductor device is prepared. A metal film is formed over the first substrate, and oxidized to form a metal oxide film having an extreme thin film thickness of several nm. Then, an insulating film and a semiconductor film are sequentially stacked over the metal oxide film. The insulating film can be either a single layer or a laminated layer having a plurality of films. For instance, silicon nitride, silicon oxynitride, silicon oxide, or the like can be used for the insulating film. A semiconductor device used for a liquid crystal display apparatus is formed by the semiconductor film.

A liquid crystal cell for a liquid crystal apparatus is formed. The liquid crystal cell includes a pixel electrode, a counter electrode, and liquid crystal disposed between the pixel electrode and the counter electrode. Specifically, a plastic substrate provided with a counter electrode, a second polarization substrate, or the like (hereinafter, counter substrate) is prepared separately, and pasted onto the semiconductor device, then, a liquid crystal cell is completed. A color filter, an orientation film, a black matrix, and the like may be provided to the counter substrate in addition to the counter electrode and the second polarization plate.

After forming the semiconductor device and the liquid crystal cell, a second substrate is pasted onto the semiconductor device and the liquid crystal cell so as to cover them. Accordingly, the liquid crystal cell is interposed between the first substrate and the second substrate.

A third substrate is pasted for reinforcing rigidity of the first substrate onto an opposite side of the first substrate on which the semiconductor device and the liquid crystal cell are formed. The first substrate can be easily separated and the semiconductor device and the liquid crystal cell are hardly damaged when rigidity of the first substrate is stronger than that of the second substrate. In addition, the third substrate is unnecessary to be pasted in case that rigidity of the first substrate is enough to be separated from the semiconductor device.

Then, the metal oxide film is crystallized by heat treatment or the like to enhance brittleness of the metal oxide film and to make it easier for the first substrate to be easily separated form the semiconductor device. Subsequently, the first substrate is separated together with the third substrate from the semiconductor device. In addition, the heat treatment to crystallize the first substrate can be carried out before pasting either the third substrate or the second substrate. Alternatively, the heat treatment in a process for forming a semiconductor device can serve as the heat treatment to crystallize the metal oxide film.

The first substrate may be separated together with the third substrate from the semiconductor device and the liquid crystal cell by splitting-off a boundary face of the metal film and the metal oxide film, the boundary face of the insulating film and the metal oxide film, or metal oxide film itself. In any case, the first substrate is separated so as the semiconductor device and the liquid crystal cell to attach to the second substrate.

A plastic substrate at the side of a light source (device substrate) is prepared for being pasted with the semiconductor device and the liquid crystal cell. A light-emitting device is provided over the device substrate, and a resin is coated to cover the light-emitting device. Then, a first polarization plate is pasted onto the resin that is flattened.

Next, by separating the first substrate, the semiconductor device and the liquid crystal cell attached to the second substrate is pasted onto the first polarization plate with adhesive or the like. Then, the second substrate is separated to fix the semiconductor device to the device substrate. And then, a liquid crystal display apparatus is completed.

In case that a plurality of liquid crystal display apparatus is formed from one large substrate, the large substrate is diced to divide into the plurality of liquid crystal display apparatus.

According to the invention, a thickness of a liquid crystal display apparatus can be at least 0.6 mm and at most 1.5 mm.

As described above, the liquid crystal display apparatus is superior in mechanical strength for shock since the device substrate and the counter substrate have flexibility compared with a glass substrate. Consequently, a thickness of the liquid crystal display apparatus can easily be reduced. Further, the freedom of shape of the liquid crystal display apparatus is increased since the device substrate and the counter substrate have flexibility. Therefore a liquid crystal display apparatus can be formed into a curved shape to be capable of pasting onto a kind of a columned bottle.

Light generated in the light-emitting device is dispersed by covering the light-emitting device with a resin that is transparent to light to equalize brightness of a pixel portion of a liquid crystal display apparatus. Brightness can be further equalized by providing dispersion plate between a liquid crystal cell and a resin covering a light-emitting device.

According to the invention, a liquid crystal display apparatus can be drastically formed into thin and reduced its weight without being damaged the mechanical strength by above described structure. Applying a liquid crystal display apparatus according to the invention to an electronic appliance, a space for using IC can be kept large and an electronic appliance can be sophisticated without preventing the electronic appliance from being lightweight and downsized. Especially, a liquid crystal display apparatus according to the present invention is useful for a portable electronic appliance since usability thereof becomes improved by reducing the weight and the size. According to the invention, even when size of a pixel portion of a liquid crystal display apparatus is increased, weight thereof is almost same as that of a liquid crystal display apparatus using a conventional glass substrate.

BRIEF DESCRIPTION OF THE DRAWINGS

FIGS. 1A to 1D are views showing cross-sectional views of a liquid crystal display apparatus according to the invention;

FIGS. 3A to 3E are explanatory views showing a method of manufacturing a liquid crystal display apparatus according to the invention;

FIGS. 7A to 7C are explanatory views showing a method for manufacturing a liquid crystal display apparatus according to the invention;

FIGS. 8A and 8B are explanatory views showing a method for manufacturing a liquid crystal display apparatus according to the invention;

FIGS. 9A and 9B are explanatory views showing a method for manufacturing a liquid crystal display apparatus according to the invention;

FIGS. 11A and 11B are explanatory views showing a method for manufacturing a liquid crystal display apparatus according to the invention;

FIGS. 13A to 13D are cross-sectional views showing an electronic card utilizing a liquid crystal display apparatus according to the invention;

FIGS. 18A to 18F are views showing electronic appliances;

FIGS. 21A and 21B are cross-sectional views showing a liquid crystal display apparatus according to the present invention.

Figure 2A:
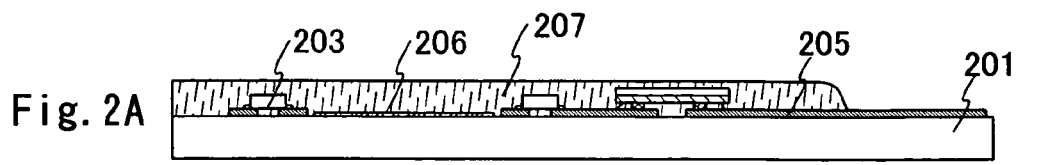
FIGS. 2A to 2D are views showing cross-sectional views of a liquid crystal display apparatus according to the invention.

These and other objects, features and advantages of the present invention will become more apparent upon reading of the following detailed description along with the accompanied drawings.

DETAILED DESCRIPTION OF THE INVENTION

The structure of a liquid crystal display apparatus according to the present invention will be explained with reference to FIGS. 1A to 1D. FIG. 1A is a cross-sectional view of a device substrate 101 before semiconductor device is pasted to the device substrate. FIG. 1B is a top surface view of the device substrate 101 illustrated in FIG. 1A. FIG. 1A is a cross-sectional view of the device substrate 101 illustrated in FIG. 1B taken along the line A-A'.

The device substrate 101 illustrated in FIGS. 1A and 1B has a concave portion 102. One or a plurality of LED 103 is provided in the concave portion 102. The concave portion 102 can be formed by a known means, for example, a mold. The driving of the LED 103 is controlled by a thin film circuit (hereinafter, LED driver thin film circuit) 104 for driving the LED 103. The LED driver thin film circuit 104 is not always necessary to be provided in the concave portion 102, that is, the LED driver thin film circuit 104 can be provided except the concave portion 102. The way of forming the LED driver thin film circuit 104 will be described later.

Reference numeral 105 denotes a wiring formed over the device substrate 101. The wiring 105 connects electrically the LED 103 to the LED driver thin film circuit 104, and also connects electrically the LED driver thin film circuit 104 to a semiconductor device pasted later to an exterior of the liquid crystal display apparatus. The wiring 105 can be formed over the device substrate 101 by a known means such as plating.

Reference numeral 106 denotes a reflection film that is formed by depositing metals by vapor deposition in the concave portion 102. To prevent short-circuiting, the reflection film 106 is deposited to be electrically separated from the wiring 105 or the LED 103. In this embodiment, as a means for reflecting light emitted from the LED 103 in the direction of a liquid crystal cell, a reflection film that is formed by vapor deposition is used, however, a reflection plate that is formed separately may be pasted onto the device substrate 101. In this case, the reflection plate is preferably pasted onto the position so as to reflect light emitted from the LED 103 in the direction of a liquid crystal cell. For instance, the reflection plate can be provided over surface that is opposing to the LED 103 and that is not provided with the concave portion 102.

The LED 103 is covered with a resin 107. In this embodiment, the resin 107 fills the concave portion 102. In case that the LED driver thin film circuit 104 is provided in the concave portion 102, the LED driver thin film circuit 104 is covered with the resin 107. As the resin 107, known resin such as acrylic resin, epoxy resin, urethane resin, polycarbonate resin, or vinyl resin can be used. Transparent particles having different refractive index from that of the resin can be dispersed in the resin 107. For instance, spherical particles can be dispersed in polymethyl methacrylate resin. It is desired that resin be appropriately selected according to the pasting process of a semiconductor device.

In FIGS. 1A and 1B, reference numeral 108 denotes a light source portion that is provided with the LED 103 and the reflection film 106, and that is covered with the resin 107.

FIG. 1C is a cross-sectional view of the liquid crystal display apparatus according to the invention in which a semiconductor device is pasted and a liquid crystal cell is completed. FIG. 1D is a top view of the liquid crystal display apparatus illustrated in FIG. 1C. FIG. 1C is a cross-sectional view of FIG. 1D taken along the line of B-B'.

A semiconductor device 110 is pasted to the resin 107 by an adhesive 109. Not shown in FIG. 1C, a first polarization plate is provided between the resin 107 and the adhesive 109. In this embodiment, as shown in FIGS. 1C and 1D, the semiconductor device 110 is not only used to a pixel portion of a liquid crystal display apparatus but also used to a thin film circuit 111 for driving or signal processing a liquid crystal display apparatus.

Reference numeral 113 denotes a counter substrate that is encapsulated with liquid crystal 112 by a sealant 114. The region where the liquid crystal 112 is encapsulated by the counter substrate 113 corresponds to a panel 115. Light from the light source portion 108 is radiated to a pixel portion 116 provided to the panel 115. In addition, the thin film circuit 111 is electrically connected to the wiring 105 by wire bonding method, flip chip method, or the like.

According to this embodiment, signals or power source voltage can be supplied to a liquid crystal display apparatus via the wiring 105, but not exclusively, signals or power source voltage may be supplied by light using a light-emitting device, a light sensor, or the like, or by electromagnetic induction using an antenna coil.

As a plastic substrate, ARTON® containing norbornene resin with polar group by JSR Corporation can be used. In addition, a plastic substrate such as polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyalylate (PAR), polybutylene terephthalate (PBT), or polyimide can be used.

An example that a concave portion is provided to a device substrate and an LED is provided in the concave portion is explained in this embodiment, however, the invention is not limited thereto. A flat plastic substrate without concave portion can be used as the device substrate.

Figure 2B:
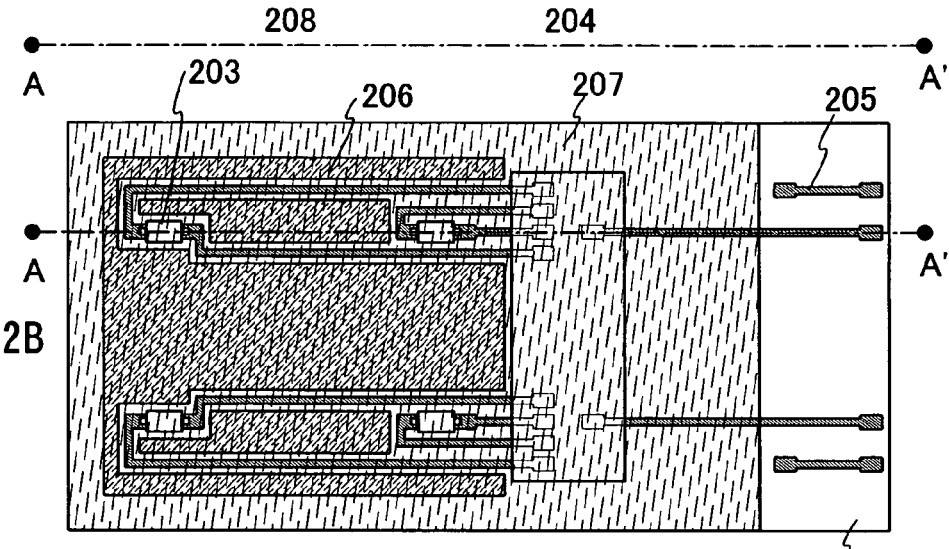

A structure of the liquid crystal display apparatus that utilizes a flat plastic substrate as a device substrate will be explained with reference to FIGS. 2A to 2D. FIG. 2A is a cross-sectional view of a device substrate in which a semiconductor device has not pasted yet. The device substrate 201 is flat and not provided with a concave portion. FIG. 2B is a top view of the device substrate 201 illustrated in FIG. 2A. FIG. 2A is a cross-sectional view of FIG. 2B taken along the line A-A'.

One or a plurality of LED 203 is provided over the device substrate 201 illustrated in FIGS. 2A and 2B. Reference numeral 204 denotes an LED driver thin film circuit. The LED driver thin film circuit 204 is electrically connected to the LED 203 by a wiring 205. The wiring 205 is used for electrically connecting the LED driver thin film circuit 204 or a semiconductor device, which is formed later, to exterior of the liquid crystal display apparatus. To prevent short-circuiting, a reflection film 206 is deposited to be separated from the wiring 205 and the LED 203. A reflection film that is formed separately can be used instead of that formed by vapor deposition.

The LED 203 is covered with a resin 207. In this embodiment, a photosensitive resin is coated and partly exposed, then, the resin 207 is coated in order to expose a part of the wiring 205. The LED driver thin film circuit 204 may also be covered with the resin 207. In FIGS. 2A and 2B, reference numeral 208 denotes a light source portion that is provided with the LED 203 and the reflection film 206, and that is covered with the resin 207.

Figure 2C:
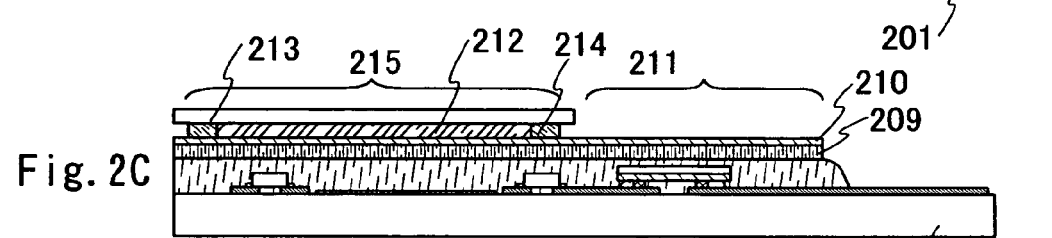
Figure 2D:
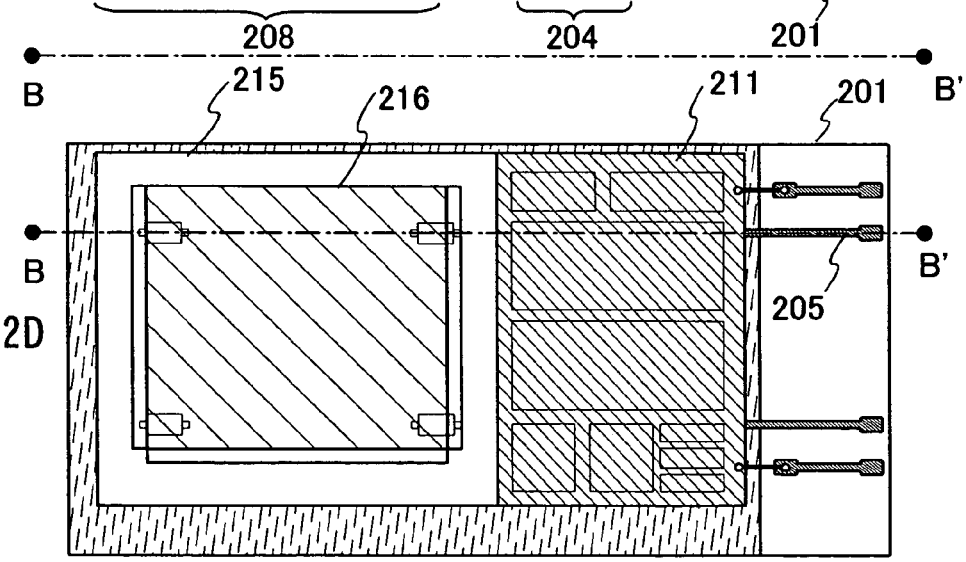

FIG. 2C is a cross-sectional view of a liquid crystal display apparatus according to the invention in which a semiconductor device is pasted and a liquid crystal cell is completed. FIG. 2D is a top view of the liquid crystal display apparatus illustrated in FIG. 2C. FIG. 2C is a cross-sectional view of FIG. 2D taken along the line of B-B'.

A semiconductor device 210 is pasted onto the resin 207 by an adhesive 209. Not shown in FIG. 2C, a first polarization plate is provided between the resin 207 and the adhesive 209. In addition, reference numeral 211 corresponds to a thin film circuit formed using the semiconductor device 210.

Reference numeral 213 denotes a counter substrate that is encapsulated with liquid crystal 212 by a sealant 214. The region where the liquid crystal 212 is encapsulated by the counter substrate 213 corresponds to a panel 215. Light from the light source portion 208 is radiated to a pixel portion 216 provided with the panel 215. In addition, the thin film circuit 211 is electrically connected to the wiring 205 by wire bonding method, flip chip method, or the like.

The concave portion of the device substrate allows the LED to be covered with a resin while wiring is exposed by only dropping a resin into the concave portion. Further, a reflection film in the concave portion allows light emitted from LED to radiate effectively to the pixel portion. In case that the concave portion is not provided, the intensity of the device substrate can be further increased compared with the case that the concave portion is provided.

Then, a specific method for manufacturing a semiconductor device used for the thin film circuit and the liquid crystal display apparatus and a way of pasting the semiconductor device onto the device substrate will be explained hereinafter. In this embodiment, though two TFTs are exemplified as the semiconductor device, the semiconductor device included in a thin film circuit and a liquid crystal display apparatus is not limited to the two TFTs, any circuit device can be used. A memory device, a diode, a photoelectric conversion device, a resistive element, a coil, a capacitance element, an inductor, or the like can be typically given as examples for the semiconductor device, in addition to TFTs.

As shown in FIG. 3A, a metal film 501 is deposited over a first substrate 500 by sputtering. Here, tungsten is used for forming the metal film 501 and formed to have a thickness of from 10 to 200 nm, preferably, from 50 to 75 nm. In this embodiment, the metal film 501 is deposited directly on the first substrate 500, but the metal film 501 may also be deposited after covering the first substrate 500 by an insulating film such as silicon oxide, silicon nitride, silicon oxynitride, or the like.

An oxide film 502 is deposited to be stacked after depositing the metal film 501 without exposing to the air. A silicon oxide film is deposited to have a thickness of from 150 to 300 nm as the oxide film 502. In case of depositing by sputtering, a film is deposited over the edge of the first substrate 500. Hence, the metal film 501 and the oxide film 502 are preferably removed selectively by $O_2$ ashing and the edge of the first substrate 500 is preferably cut by dicing to prevent the oxide film 502 from remaining over the first substrate 500 in separating in a later process.

In depositing the oxide film 502, pre-sputtering, that is, plasma is generated by shielding between a target and a substrate with shutter, is carried out as a preliminary step toward sputtering. The first substrate 500 is pre-sputtered under the equilibrium state, that is, Ar flow rate used is 10 sccm; $O_2$, 30 sccm; substrate temperature, 270° C.; and deposition power, 3 kW. A metal oxide film 503 is deposited having an ultra thin thickness of several nm (here, 3 nm) between the metal film 501 and the oxide film 502 by the pre-sputtering. The metal oxide film 503 is formed by oxidization of the metal film 501. Hence, the metal oxide film 503 is formed of tungsten oxide.

The metal oxide film 503 is, but not exclusively, deposited by pre-sputtering in this embodiment. For example, the metal oxide film 503 may be deposited by oxidizing deliberately the surface of the metal film 501 in plasma using oxygen or oxygen added with inert gases such as Ar or the like.

After depositing the oxide film 502, a base film 504 is deposited by plasma chemical vapor deposition (hereinafter, PCVD). Here, a silicon oxynitride film is deposited to have a thickness approximately of 100 nm as the base film 504. After depositing the base film 504, a semiconductor film 505 is deposited without exposing to the atmosphere. The semiconductor film 505 is formed to have a thickness of from 25 to 100 nm, preferably, from 30 to 60 nm. The semiconductor film 505 may be either an amorphous semiconductor or a polycrystalline semiconductor. The semiconductor film may be formed by not only silicon but also silicon germanium. In case of using silicon germanium, the concentration of germanium is preferably approximately from 0.01 to 4.5 atomic %.

As shown in FIG. 3B, the semiconductor film 505 is crystallized by a known technique. As the known technique, thermal crystallization using an electric heating furnace, laser crystallization using a laser light, and ramp annealing crystallization using an infrared light. Alternatively, crystallization using catalytic elements can be used according to the technique disclosed in Unexamined Patent Publication No. 7-130652.

The semiconductor film 505 that is a polycrystalline semiconductor film may be formed in advance by sputtering, PCVD, or thermal CVD.

The semiconductor film 505 is crystallized by laser crystallization in this embodiment. A crystal having a large grain diameter can be obtained by laser light irradiation of from a second harmonic to a fourth harmonic of a fundamental wave by using a solid laser capable of continuously oscillating. Typically, a second harmonic (532 nm) or a third harmonic (355 nm) of Nd:YVO$_4$ laser (fundamental wave of 1064 nm) may be applied. When a continuously oscillating laser is used, a laser light emitted from the continuously oscillating YVO$_4$ laser having an output power of 10 W is converted to a harmonic by a nonlinear optical device. There is also a method in which a harmonic is outputted by using nonlinear optical device. Preferably, the laser light is formed by using an optical system such that it becomes in a rectangular shape or an elliptical shape on an irradiating face and radiated to the semiconductor film 505. The laser irradiation is carried at energy density of approximately from 0.01 to 100 MW/cm$^2$ (preferably from 0.1 to 10 MW/cm$^2$) and a scanning speed of approximately from 10 to 2000 cm/s.

The laser crystallization may be carried out by radiating a continuous wave laser light of fundamental wave and a continuous wave laser light of harmonic wave, or radiating a continuous wave laser light of fundamental wave and a pulsed laser light of harmonics.

A laser light may be radiated in an inert gas atmosphere such as rare gas or nitride. According to this, the surface roughness of a semiconductor due to a laser irradiation, further, the variations of a threshold value due to the variations of interface state density can be prevented.

A semiconductor film 506 that is enhanced its degree of crystallinity is formed by irradiating the above described semiconductor film 505 with a laser light. Next, as shown in FIG. 3C, the semiconductor film 506 is patterned to form island like semiconductor films 507, 508. Various semiconductor devices as typified by TFTs are formed using the island like semiconductor films 507, 508. In this embodiment, the base film 504 and the island like semiconductor films 507, 508 are in contact with each other, but an electrode, an insulating film, or the like may be formed between the base film 504 and the island like semiconductor films 507, 508 depending on a semiconductor device. For example, in case of a bottom gate type TFT that is one of the semiconductor devices, a gate electrode and a gate insulating film are formed between the base film 504 and the island like semiconductor films 507, 508.

In this embodiment, top gate type TFTs 509 and 510 are formed using the island like semiconductor films 507, 508 (FIG. 3D). Specifically, a gate insulating film 511 is deposited so as to cover the island like semiconductor films 507, 508. Then, a conductive film is deposited over the gate insulating film 511 and patterned, and gate electrodes 512, 513 are formed. Next, impurities imparting n-type are added to the island like semiconductor films 507, 508 using the gate electrodes 512, 513 or resist that is deposited and patterned as masks to form a source region, a drain region, and an LDD (Lightly Doped Drain) region. Here, TFTs 509, 510 are n-type, in case of using p-type TFTs, impurities imparting p-type are added.

According to the above described process, TFTs 509, 510 can be formed. A method for manufacturing the TFTs is not limited to the above described process.

A first interlayer insulating film 514 is fabricated so as to cover the TFTs 509, 510. Contact holes are formed at the gate insulating film 511 and the first interlayer insulating film 514, and terminals 515 to 518 connected to the TFTs 509, 510 via the contact holes are formed so as to be in contact with the first interlayer insulating film 514.

A pixel electrode 540 of a liquid crystal cell is formed by a transparent conductive film such as ITO so as to be in contact with the terminal 515. Then, an orientation film 541 is formed to cover the pixel electrode 540, and rubbing treatment is carried out to the orientation film 541. A part of the terminal 518 is exposed by etching or the like so as not to be covered by the orientation film 541.

A protective layer 521 is formed over the orientation film 541. As a material for forming the protective layer 521, a material which can protect the surface of the TFTs 509, 510, the orientation film 541, and terminals 515 to 518 in pasting or separating the second substrate in a later process, and which can be removed after separating a second substrate is used. For example, the protective film 521 can be formed by coating resin of epoxy series, acrylate series, or silicon series that is soluble in water over the whole surface, and baking.

In this embodiment, a water-soluble resin (TOAGOSEI Co., Ltd.: VL-WSHL10) is spin-coated to have a thickness of 30 μm, and exposed for two minutes to be partially cured, then, exposed its back with UV rays for 2.5 minutes, and then, exposed its surface for 10 minutes, that is, 12.5 minutes in total, to be fully cured. Consequently, the protective layer 521 is formed (FIG. 3E).

Though an example that the protective layer 521 is formed after the orientation film 541 is formed is explained in this embodiment, the orientation film 541 may be formed after removing the protective layer 521 in a later process. However, in case of stacking a plurality of organic resins, there is a threat of melting the stacked organic resin depending on the solvent in coating or baking, or increasing excessively its density. In case of forming the protective layer 521 after forming the orientation film 541, each of which is formed by organic resin soluble in the same etchant, an inorganic insulating film (a SiN$_X$ film, a SiN$_X$O$_Y$ film, an AlN$_X$ film, or an AlN$_X$O$_Y$ film) is preferably formed so as to cover the first interlayer insulating film 514, and be disposed between the first interlayer insulating film 514 and the terminals 515 to 518 for removing smoothly the protective film 521 in a later process.

For separating smoothly in a later process, the metal oxide film 503 is crystallized. By this crystallization, the metal oxide film 503 becomes susceptible to fracture in grain boundary and enhanced its brittleness. The crystallization is carried out by heat-treating for approximately at from 420 to 550° C. for from 0.5 to 5 hours.

Then, some treatments are carried out on the metal oxide film 503 in order to make it easier for the metal oxide film 503 to be separated by weakening partly the adhesiveness between the metal oxide film 503 and the oxide film 502 or the adhesiveness between the metal oxide film 503 and the metal film 501. Specifically, the periphery of the region that is to be separated is locally pressed from outside to be damaged a part of the inside or the boundary face-neighborhood of the oxide film 503. Specifically, a hard needle such as a diamond pen is attached perpendicular to the edge-neighborhood of the metal oxide film 503 and moved along with the metal oxide film 503 with applying loading. Preferably, a scriber device can be used to move with applying loading on the region with press force ranging from 0.1 to 2 mm. It is important to carry out some treatment for easy separating, that is, it is important to prepare for separating process. Such preparatory process to weaken selectively the adhesiveness will prevent poor separating and improve the process yield.

Figure 4A:
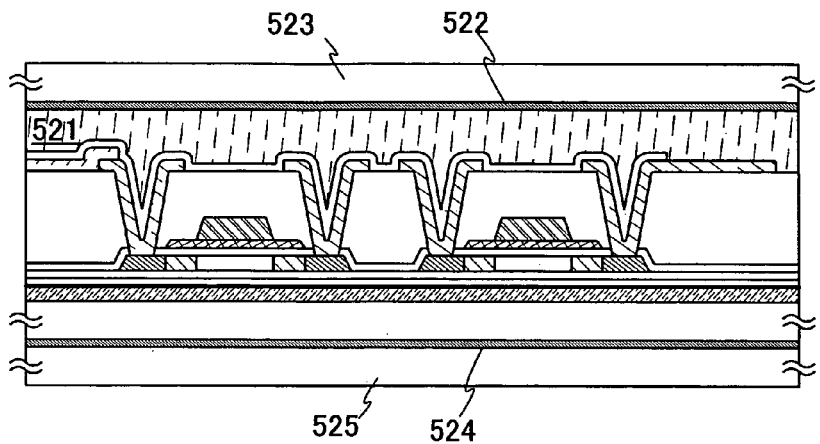
FIGS. 4A to 4C are explanatory views showing a method for manufacturing a liquid crystal display apparatus according to the invention.

Next, a second substrate 523 is pasted onto the protective film 521 with a two-sided tape 522, and a third substrate 525 is pasted over the first substrate 500 with a two-sided tape 524 (FIG. 4A). An adhesive can be used instead of a two-sided tape. For example, it is possible to reduce the load of a semiconductor device, which becomes increased by separating the second substrate, by using an adhesive that is melted with UV light.

The third substrate 525 prevents the first substrate 500 from being damaged in a later process for separating. For the second substrate 523 and the third substrate 525, the substrate that has higher rigidity than that of the first substrate 500, for example, a quartz substrate or a semiconductor substrate is preferably to be used.

Then, the metal film 501 is separated from the oxide film 502 by a physical means. The separation of metal film 501 is started from the region that is partly weakened its adhesiveness to the metal film 501 or the oxide film 502 in the previous process.

Figure 4B:
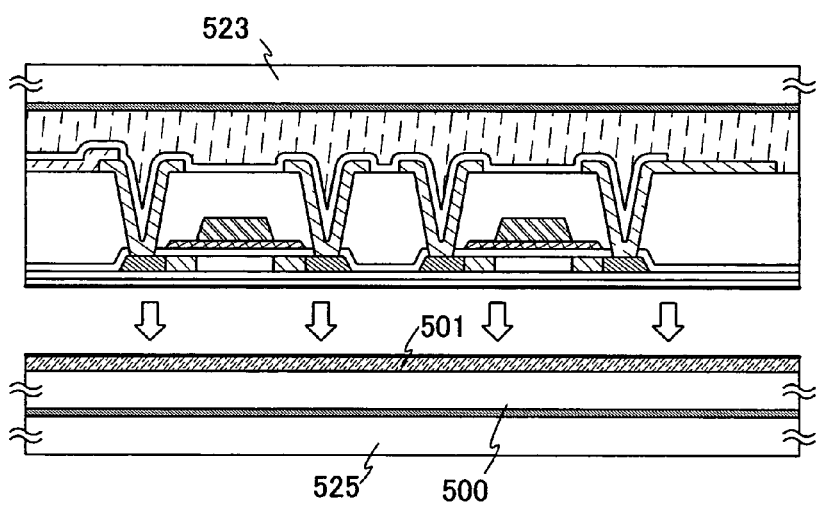

The metal film 501 may be removed by separating the metal film 501 from metal oxide film 503, by separating the oxide film 502 from the metal oxide film 503, or splitting the metal oxide film 503 into two. Further, the second substrate 523 to which semiconductor devices (here, TFTs 509, 510) are pasted is separated from the third substrate 525 to which the first substrate 500 and the metal film 501 are pasted. The separation can be carried out with comparatively small force (for example, man's hand, air pressure of gas sprayed from a nozzle, ultrasonic waves, or the like). FIG. 4B shows a state of after separating.

Figure 4C:
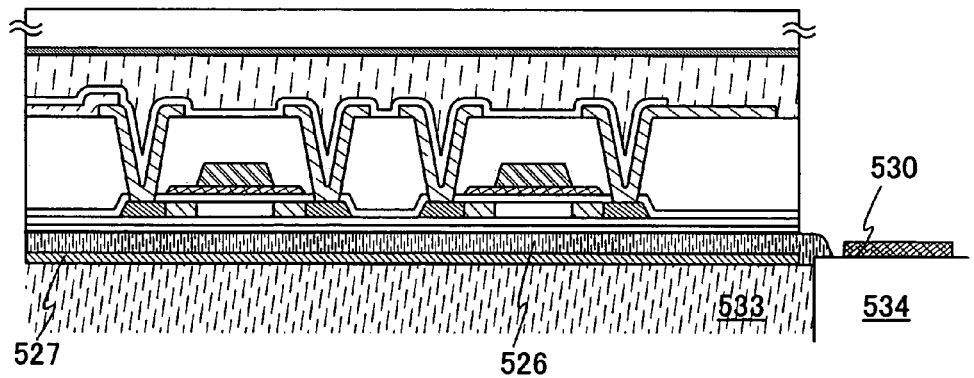

A first polarization plate 527 provided over a resin 533 is bonded to the oxide layer 502 that is partly attached with the metal oxide film 503 with an adhesive 526 (FIG. 4C). At this time, it is important that the material for the adhesive 526 is selected in order that the adhesiveness between the oxide layer 502 and the first polarization plate 527 by the adhesive 526 to be stronger than that between the second substrate 523 and the protective layer 521 by the two-sided tape 522.

If the metal oxide film 503 is remained over the surface of the oxide film 502, the adhesiveness of the polarization plate 527 may get worse, so that the remained metal oxide film may be completely removed before bonding to the oxide film 502.

In case of using the semiconductor devices 509, 510 are used for the thin film circuit, the semiconductor devices 509, 510 are unnecessary to be pasted to overlap with the first polarization plate 527.

As the adhesive 526, various curing adhesives such as a photo-curing adhesive, for example, a reaction-curing adhesive, a thermal-curing adhesive, or a UV-curing adhesive, or an anaerobic adhesive can be used. More preferably, the adhesive 526 is given high thermal conductivity by means of mixing powder comprising silver, nickel, aluminum, or aluminum nitride, or filler.

In addition, reference numeral 530 denotes a wiring formed over the device substrate 534. The wiring 530 is formed by coating copper with solder, gold, or tin.

Figure 5A:
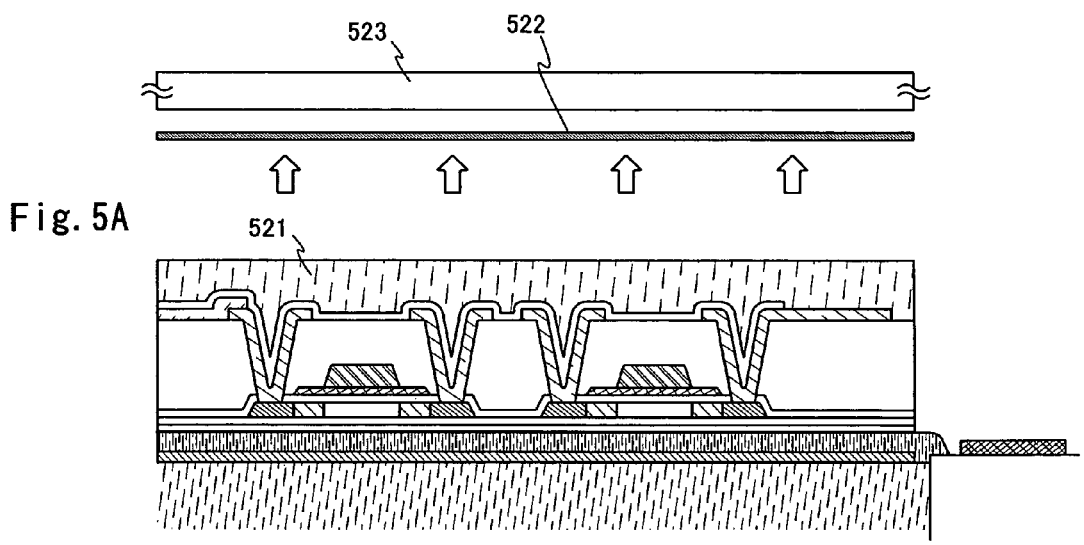
FIGS. 5A and 5B are explanatory views showing a method for manufacturing a liquid crystal display apparatus according to the invention.

As shown in FIG. 5A, the two-sided tape 522 and the second substrate 523 are separated sequentially or simultaneously from the protective layer 521. The two-sided tape 522 can be separated simultaneously with curing the adhesive 526 by using UV-curing adhesive as the adhesive 526, and by using a tape or adhesive that is separated by UV light as the two-sided tape 522.

Figure 5B:
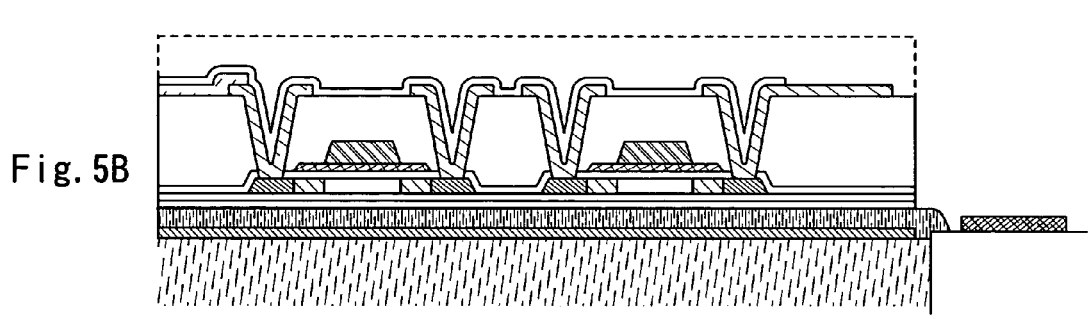

As shown in FIG. 5B, the protective film 521 is removed by water since the protective film 521 is formed by a resin that is soluble in water. In case that the remained protective film 521 causes deterioration, the remained protective film 521 is preferably removed by carrying out cleaning treatment or $O_2$ plasma treatment to the surface.

In this embodiment, tungsten is used for a material of the metal film 501, however, the present invention is not limited thereto. Any material can be used as long as which includes metals that allows a substrate to be separated by forming the metal oxide film 503 over the surface of the material and crystallizing the metal oxide film 503. For instance, TiN, WN, Mo, or the like can be used in addition to tungsten. In case of using these alloys as the metal film, the optimal temperature for heat treatment to crystallize differs depending on the composition ratio of the metal film. On the basis of the fact, the heat treatment can be carried out at the temperature that has no adverse effects on the manufacturing process for a semiconductor device, and selection ranges of the manufacturing process become difficult to be restricted by adjusting the composition ratio of the metal film.

Figure 6:
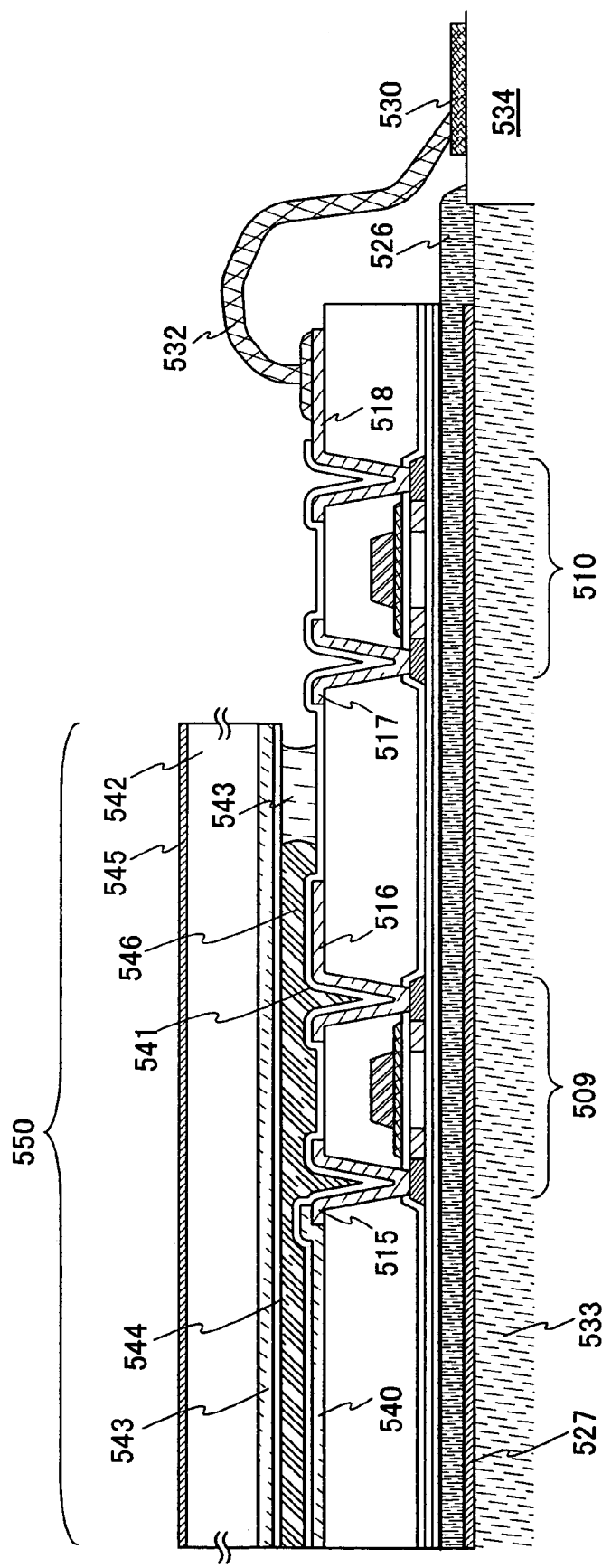
FIG. 6 is an explanatory view showing a method for manufacturing a liquid crystal display apparatus according to the invention.

A liquid crystal cell is formed as illustrated in FIG. 6.

After the protective layer 521 is formed, a counter substrate 542 that is formed separately is pasted with sealant 543. Filler may be mixed into the sealant. The counter substrate 542 has a thickness of approximately several hundreds μm, and is provided with a counter electrode 543 formed by a transparent conductive film and an orientation film 544 that is rubbing treated. In addition, a color filter and a black matrix (a shielding film) to prevent disclination may be formed. Further, a second polarization plate 545 is pasted onto the opposite side of the counter electrode 543 on which the counter substrate 542 is formed.

Then, liquid crystal 546 is injected and encapsulated to complete a panel 550. In addition, the way of injecting liquid crystal may be dispenser method or dip method. A spacer may be provided between the pixel electrode 540 and the counter electrode 543 for keeping cell gaps. The liquid crystal display apparatus is completed by connecting electrically the terminal 518 to the wiring 530 provided with the device substrate 534 by wire bonding method.

Then, a method for manufacturing a liquid crystal display apparatus according to the invention, which is different from that illustrated in FIGS. 3 to 6, will be explained. In this embodiment, though a TFT is exemplified as the semiconductor device, the semiconductor device included in a thin film circuit and a liquid crystal display apparatus is not limited to the TFT, any circuit device can be used. For example, a memory device, a diode, a photoelectric conversion device, a resistive element, a coil, a capacitance element, an inductor, or the like can be typically given, in addition to TFTs.

As shown in FIG. 7A, a metal film 1501 is deposited over a first substrate 1500 by sputtering. Here, tungsten is used for forming the metal film 1501 and formed to have a thickness of from 10 to 200 nm, preferably, from 50 to 75 nm. In this embodiment, the metal film 1501 is deposited directly on the first substrate 1500, but the metal film 1501 may also be deposited after covering the first substrate 1500 by an insulating film such as silicon oxide, silicon nitride, silicon oxynitride, or the like.

An oxide film 1502 composing the insulating film is deposited to be stacked after depositing the metal film 1501 without exposing to the air. A silicon oxide film is deposited to have a thickness of from 150 to 300 nm as the oxide film 1502. In case of depositing by sputtering, a film is deposited over the edge of the first substrate 1500. Hence, the metal film 1501 and the oxide film 1502 are preferably removed selectively by $O_2$ ashing to prevent the oxide film 1502 from remaining over the first substrate 1500 in separating in a later process.

In depositing oxide film 1502, pre-sputtering, that is, plasma is generated by shielding between a target and a substrate with shutter, is carried out as a preliminary step toward sputtering. The first substrate 1500 is pre-sputtered under the equilibrium state, that is, Ar flow rate used is 10 sccm; $O_2$, 30 sccm; substrate temperature, 270° C.; and deposition power, 3 kW. A metal oxide film 1503 is deposited having an ultra thin thickness of several nm (here, 3 nm) between the metal film 1501 and the oxide film 1502 by the pre-sputtering. The metal oxide film 1503 is formed by oxidization of the metal film 1501. Hence, the metal oxide film 1503 is formed of tungsten oxide.

The metal oxide film 1503 is, but not exclusively, deposited by pre-sputtering in this embodiment. For example, the metal oxide film 1503 may be deposited by oxidizing deliberately the surface of the metal film 1501 in plasma using oxygen or oxygen added with inert gases such as Ar or the like.

After depositing the oxide film 1502, a base film 1504 composing the insulating film is deposited by PCVD. Here, a silicon oxynitride film is deposited to have a thickness of approximately 100 nm as the base film 1504. After depositing the base film 1504, a semiconductor film 1505 is deposited without exposing to the atmosphere. The semiconductor film 1505 is formed to have a thickness of from 25 to 100 nm, preferably, from 30 to 60 nm. The semiconductor film 1505 may be either an amorphous semiconductor or a polycrystalline semiconductor. The semiconductor film may be formed by not only silicon but also silicon germanium. In case of using silicon germanium, the concentration of germanium is preferably approximately from 0.01 to 4.5 atomic %.

Next, the semiconductor film 1505 is crystallized by a known technique. As the known technique, thermal crystallization using an electric heating furnace, laser crystallization using a laser light, and ramp annealing crystallization using an infrared light. Alternatively, crystallization using catalytic elements can be used according to the technique disclosed in Unexamined Patent Publication No. 7-130652.

The semiconductor film 1505 is crystallized by laser crystallization in this embodiment. Before the laser crystallization, the semiconductor film is thermal-annealed at 500° C. for 1 hour to increase resistance of the semiconductor film to laser. In this embodiment, the heat treatment enhances the brittleness of the metal oxide film 1503 to make it easier for the first substrate 1500 to be separated later. By this crystallization, the metal oxide film 1503 becomes susceptible to fracture in grain boundary and enhanced its brittleness. The crystallization of the metal oxide film 1503 is preferably carried out by heat-treating for approximately at from 420 to 550° C. from 0.5 to 5 hours.

A crystal having a large grain diameter can be obtained by laser light irradiation of from a second harmonic to a fourth harmonic of a fundamental wave by using a solid laser capable of continuously oscillating. Typically, a second harmonic (532 nm) or a third harmonic (355 nm) of Nd: $YVO_4$ laser (fundamental wave of 1064 nm) may be applied. When a continuously oscillating laser is used, a laser light emitted from the continuously oscillating $YVO_4$ laser having an output power of 10 W is converted to a harmonic by a nonlinear optical device. There is also a method in which a harmonic is outputted by using a nonlinear optical device. Preferably, the laser light is formed by using an optical system such that it becomes in a rectangular shape or an elliptical shape when radiated to an irradiating face, and radiated to the semiconductor film 1505. On this occasion, an energy density of approximately from 0.01 to 100 $MW/cm^2$ (preferably from 0.1 to 10 $MW/cm^2$) is necessary and a semiconductor film may be irradiated with the laser light while it is moved relatively thereto at a speed of approximately from 10 to 2000 cm/s.

The laser crystallization may be carried out by radiating a continuous wave laser light of fundamental wave and a continuous wave laser light of harmonic wave, or radiating a continuous wave laser light of fundamental wave and a pulsed laser light of harmonics.

A laser light may be radiated in the inert gas atmosphere such as rare gas or nitride. According to this, the surface roughness of a semiconductor due to a laser irradiation, further, the variations of a threshold value due to the variations of interface state density can be prevented.

The crystallinity of the semiconductor film 1505 is further enhanced by the above described crystallization. The semiconductor film 1505 that is a polycrystalline semiconductor film may be formed in advance by sputtering, PCVD, thermal CVD, or the like.

Next, as shown in FIG. 7B, the semiconductor film 1505 is patterned to form island like semiconductor films 1507, 1508. Various semiconductor devices as typified by TFTs are formed using the island like semiconductor films 1507, 1508. In this embodiment, the base film 1504 and the island like semiconductor films 1507, 1508 are in contact with each other, but an electrode, an insulating film, or the like may be formed between the base film 1504 and the island like semiconductor films 1507, 1508 depending on a semiconductor device. For example, in case of a bottom gate type TFT that is one of the semiconductor devices, a gate electrode and a gate insulating film are formed between the base film 1504 and the island like semiconductor films 1507, 1508.

In this embodiment, top gate type TFTs 1509, 1510 are formed using the island like semiconductor films 1507, 1508 (FIG. 7C). Specifically, a gate insulating film 1511 is deposited so as to cover the island like semiconductor films 1507, 1508. Then, a conductive film is deposited over the gate insulating film 1511 and patterned, and then, gate electrodes 1512, 1513 are formed. Next, impurities imparting n-type are added to the gate electrodes 1507, 1508 using the gate electrodes 1512, 1513 or resist that is deposited and patterned as masks to form a source region, a drain region, and an LDD (Lightly Doped Drain) region. Here, TFTs 1509, 1510 are n-type, but impurities imparting p-type are added in case of using p-type TFTs.

According to the above described process, TFTs 1509, 1510 can be formed. A method for manufacturing the TFTs is not limited to the above described process.

A first interlayer insulating film 1514 is fabricated so as to cover the TFTs 1509, 1510. Contact holes are formed in the gate insulating film 1511 and the first interlayer insulating film 1514, and terminals 1515 to 1518 connected to the TFTs 1509, 1510 via the contact holes are formed so as to be in contact with the first interlayer insulating film 1514.

The TFT 1510 used as a switching element of the pixel portion of the liquid crystal display apparatus is electrically connected to the terminal 1518. A pixel electrode of a liquid crystal cell is formed by transparent conductive film such as ITO so as to connect to the terminal 1518. A spacer 1519 is formed by using an insulating film. Then, an orientation film 1520 is formed to cover the pixel electrode 1550, the terminal 1518, and the spacer 1519, and rubbing treatment is carried out thereto. In addition, the orientation film 1520 may be formed to overlap with the thin film circuit.

Then, a sealant 1521 is formed to encapsulate liquid crystal. As shown in FIG. 8A, liquid crystal 1522 is dropped in the region encircled by the sealant 1521. A counter substrate 1523 that is formed separately is pasted with sealant 1521. FIG. 8B is a view showing a state after the counter substrate 1523 is pasted. Filler may be mixed into the sealant 1521. The counter substrate 1523 has a thickness of approximately several hundreds μm, and is provided with a counter electrode 1524 formed by a transparent conductive film and an orientation film 1526 that is rubbing treated. In addition, a color filter and a black matrix (a shielding film) to prevent disclination may be formed. Further, a second polarization plate 1527 is pasted onto the opposite side of the counter electrode 1524 on which the counter substrate 1523 is formed.

The region where the counter electrode 1524, the liquid crystal 1522, and the pixel electrode 1550 are overlapped each other corresponds to a liquid crystal cell 1528. When the liquid crystal cell 1528 is completed, a panel 1529 is also completed. In addition, though a thin film circuit 1530 is not overlapped with the counter substrate 1523, the thin film circuit 1530 may dare to be overlapped with the counter substrate 1523. In this case, a resin may be filled between the counter substrate and the thin film circuit to increase mechanical strength of a liquid crystal display apparatus.

In this embodiment, the liquid crystal is encapsulated by dispenser method (dropping method) though, the invention is not limited thereto. The liquid crystal may be encapsulated by dipping method (pumping method) utilizing capillary phenomenon after pasting the counter substrate onto the liquid crystal.

Next, as shown in FIG. 9A, a protective film 1531 is formed to cover the thin film circuit 1530 and the panel 1529. The protective layer 1531 is formed by a material that can protect the thin film circuit 1530 and the panel 1529 in pasting or separating a second substrate 1533 later, and that can be removed after separating the second substrate 1533. For example, the protective film 1531 can be formed by coating resin of epoxy series, acrylate series, or silicon series that is soluble in water over the whole surface.

In this embodiment, a water-soluble resin (TOAGOSEI Co., Ltd.: VL-WSHL10) is spin-coated to have a thickness of 30 μm, and exposed for two minutes to be partially cured, then, exposed its back with UV rays for 2.5 minutes, and then, exposed its surface for 10 minutes to be fully cured. Consequently, the protective layer 1531 is formed.

In case of stacking a plurality of organic resins, there is a threat of melting the stacked organic resin depending on the solvent in coating or baking, or increasing excessively its density. In case of forming simultaneously both the first interlayer insulating film 1514 and the protective layer 1531, each of which is formed by organic resin soluble in the same etchant, an inorganic insulating film (a $SiN_X$ film, a $SiN_XO_Y$ film, an $AlN_X$ film, or an $AlN_XO_Y$ film) is preferably formed so as to cover the first interlayer insulating film 1514.

Then, some treatments are carried out on the metal oxide film 1503 in order to make it easier for the metal oxide film 1503 to be separated by weakening partly the adhesiveness between the metal oxide film 1503 and the oxide film 1502 or the adhesiveness between the metal oxide film 1503 and the metal film 1501. Specifically, the periphery of the region that is to be separated is locally pressed from outside to damage a part of the inside or the boundary face-neighborhood of the oxide film 1503. Specifically, a hard needle such as a diamond pen is attached perpendicular to the edge-neighborhood of the metal oxide film 1503 and moved along with the metal oxide film 1503 with applying loading. Preferably, a scriber device can be used to move with applying loading on the region with press force ranging from 0.1 to 2 mm. It is important to carry out some treatment for easy separating, that is, it is important to prepare for separating. Such preparatory process to weaken selectively the adhesiveness will prevent poor separating and improve the process yield.

Next, a second substrate 1533 is pasted onto the protective layer 1531 with a two-sided tape 1532, and a third substrate 1535 is pasted over the first substrate 1500 with a two-sided tape 1534. An adhesive can be used instead of a two-sided tape. For example, it is possible to reduce the load of a semiconductor device, which is increased by separating the second substrate, by using an adhesive that is melted with UV light. The third substrate 1535 prevents the destruction of the first substrate 1500 in the subsequent process of separating. For the second substrate 1533 and the third substrate 1535, the substrate that has higher rigidity than that of the first substrate 1500, for example, a quartz substrate or a semiconductor substrate is preferably to be used.

Then, the metal film 1501 is separated from the oxide film 1502 by a physical means. The separation of metal film 1501 is started from the region that is partly weakened its adhesiveness with respect to the metal film 1501 or the oxide film 1502 in the previous process.

Three separating portions may be resulted from the separation of metal film 1501, that is, the separating portion of the metal film 1501 and metal oxide film 1503, the separating portion of the oxide film 1502 and the metal oxide film 1503, or the separating portion within the metal oxide film 1503. Further, the second substrate 1533 on which semiconductor devices (here, TFTs 1509, 1510) are pasted is separated from the third substrate 1535 on which the first substrate 1500 and the metal film 1501 are pasted. The separation can be carried out with comparatively small force (for example, man's hand, air pressure of gas sprayed from a nozzle, ultrasonic waves, or the like). FIG. 9B shows a state of after the separating process.

Figure 10:
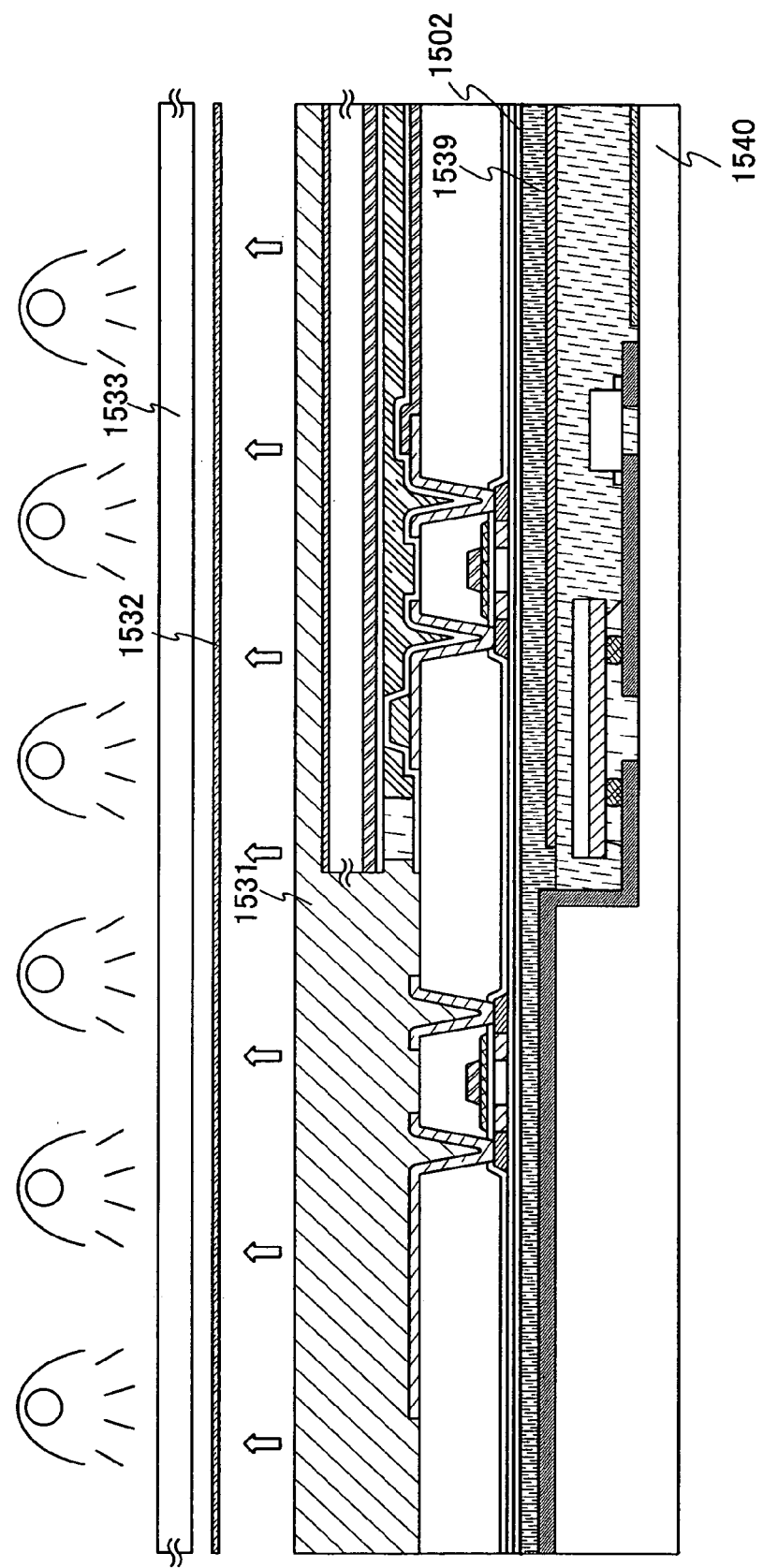
FIG. 10 is an explanatory view showing a method for manufacturing a liquid crystal display apparatus according to the invention.

A device substrate 1540 is bonded with an adhesive 1539 to the oxide layer 1502 that is partly attached with the metal oxide film 1503 (FIG. 10). At this time, it is important that the material for the adhesive 1539 is selected in order that the adhesiveness to be stronger between the oxide layer 1502 and the device substrate 1540 by the adhesive 1539 than that between the second substrate 1533 and the protective layer 1531 by the two-sided tape 1532.

As the adhesive 1539, various curing adhesives such as a photo-curing adhesive, for example, a reaction-curing adhesive, a thermal-curing adhesive, or a UV-curing adhesive, or an anaerobic adhesive can be used. More preferably, the adhesive 1539 is given high thermal conductivity by means of mixing powder comprising silver, nickel, aluminum, or aluminum nitride, or filler.

If the metal oxide film 1503 is remained over the surface of the oxide film 1502, the adhesiveness of the device substrate 1540 may get worse, so that the remained metal oxide film may be completely removed by etching or the like before bonding to a printed wiring board.

As shown in FIG. 10, the two-sided tape 1532 and the second substrate 1533 are separated sequentially or simultaneously from the protective layer 1531. The two-sided tape 1532 can be separated simultaneously with curing the adhesive 1539 by using UV-curing adhesive as the adhesive 1539, and by using a tape or adhesive that is separated by UV light as the two-sided tape 1532.

As shown in FIG. 11A, the protective film 1531 is removed by water since the protective film 1531 is formed by a resin that is soluble in water. In case that the remained protective film 1531 causes deterioration, the remained protective film 1531 is preferably removed by carrying out cleaning treatment or $O_2$ plasma treatment to the surface.

A terminal 1518, a wiring 1551 provided with the device substrate 1540 are electrically connected each other by a wiring 1552 by wire bonding method, and a liquid crystal display apparatus is completed. The wiring 1551 is completed, for example, by coating copper with gold or tin. In addition, a timing for connecting the terminal 1518 and the wiring 1551 is not limited to the above described one.

It can be considered that a liquid crystal display apparatus is completed in this state. However, according to this embodiment, mechanical strength of the liquid crystal display apparatus is enhanced by encapsulating the liquid crystal display apparatus by a sealing member.

As shown in FIG. 11B, the thin film circuit 1530 and the panel 1529 are covered with a resin 1542 and a cover member 1543 is provided to protect the thin film circuit 1530 and the panel 1529. In addition, the cover member 1543 is not always necessary to be provided, the device substrate 1540 can be covered directly with a sealing member.

As material for the sealing member used for encapsulating the liquid crystal display apparatus, a material that is used in general can be used. For instance, polymeric material such as polyester, acrylic acid, polyvinyl acetate, propylene, chloroethene, acrylonitrilebutadiene styrene resin, or polyethylene terephthalate can be used. The pixel portion of the liquid crystal display apparatus is exposed, or a material for the resin 1542 or a cover member 1543 is appropriately selected in encapsulating in order to pass light therethrough.

By encapsulating a liquid crystal display apparatus with a sealing member, mechanical strength of the liquid crystal display apparatus is enhanced, heat generated in the liquid crystal display apparatus is radiated, and electromagnetic noises from adjacent circuit of external of the liquid crystal display apparatus can be rejected.

A plastic substrate can be used for the device substrate 1540, the cover member 1543, and the counter substrate 1523. As a plastic substrate, ARTON® containing norbornene resin with polar group by JSR Corporation can be used. In addition, a plastic substrate such as polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyalylate (PAR), polybutylene terephthalate (PBT), or polyimide can be used. It is desired that the device substrate 1540 has high thermal conductivity of approximately from 2 to 30 W/mK to radiate heat generated in the liquid crystal display apparatus.

In this embodiment, tungsten is used for a material of the metal film 1501, however, the present invention is not limited thereto. Any material can be used as long as which includes metals that allows a substrate to be separated by forming the metal oxide film 1503 over the surface of the material and crystallizing the metal oxide film 1503. For instance, TiN, WN, Mo, or the like can be used in addition to tungsten. In case of using these alloys as the metal film, the optimal temperature for heat treatment to crystallize differs depending on the composition ratio of the metal film. On the basis of the fact, the heat treatment can be carried out at the temperature that has no adverse effects on the manufacturing process for a semiconductor device, and selection ranges of the manufacturing process become difficult to be restricted by adjusting the composition ratio of the metal film.

In addition, a semiconductor device used for an LED driver thin film circuit can be formed according to the above described method for forming a semiconductor device.

A material for a resin covering a light-emitting diode is preferably and appropriately selected depending on the method for curing a first substrate, a second substrate, and an adhesive.

An example that a wiring formed over a device substrate is electrically connected to a thin film circuit or an LED driver thin film circuit by flip chip method instead of wire bonding method will be explained hereinafter.

Figure 12A:
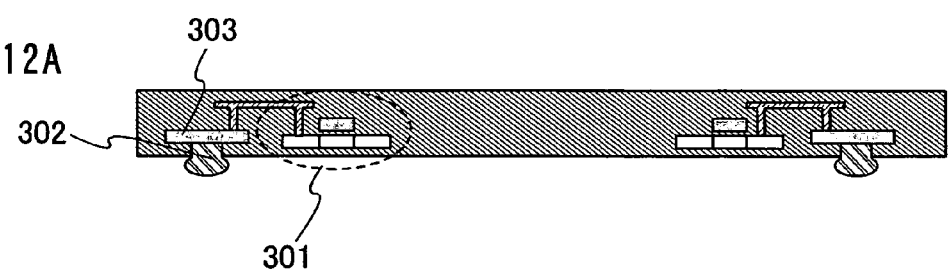
FIGS. 12A to 12C are cross-sectional views showing a thin film circuit or an LED driver thin film circuit.

FIG. 12A is a cross-sectional view of a thin film circuit or an LED driver thin film circuit, each of which is provided with solder balls.

As shown in FIG. 12A, a semiconductor device 301 is electrically connected to a wiring over a device substrate with a solder ball 302. The solder ball 302 is provided to the side of the device substrate of the semiconductor device 301 and connected to an electrode 303 that is electrically connected to the semiconductor device 301. The electrode 303 may be formed by a conductive film that is the same as that of a gate electrode of a TFT in case that the semiconductor device is the TFT.

Figure 12B:
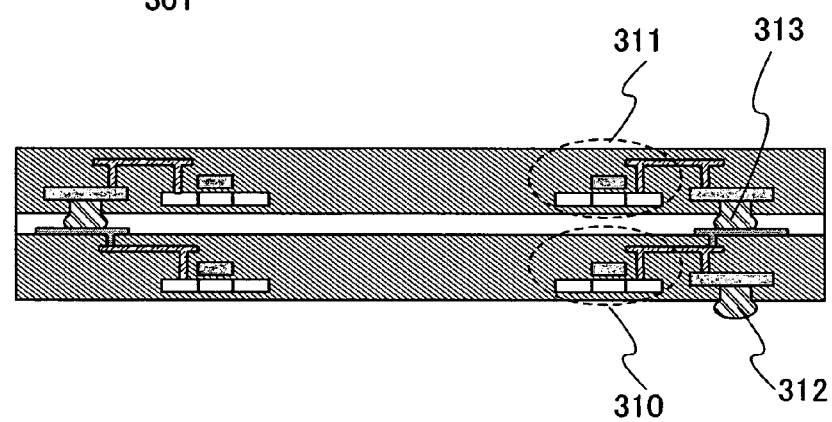

FIG. 12B is a cross-sectional view of the thin film circuit or the LED driver thin film circuit in which semiconductor devices are stacked by flip chip method. As shown in FIG. 12B, semiconductor devices 310 and 311, each of which is provided to two layers, are stacked. A wiring provided to a device substrate is electrically connected to the semiconductor device 310 with a solder ball 312. In addition, the semiconductor device 310 is electrically connected to the semiconductor device 311 with a solder ball 313.

Figure 12C:
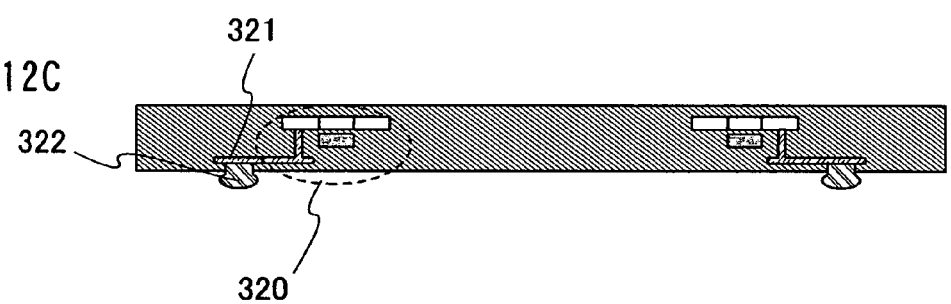

FIG. 12C is a view showing an example that a wiring formed over a device substrate is connected to a solder ball. As shown in FIG. 12C, a solder ball 312 is connected to a wiring 321 directly connected to a semiconductor device 320.

In addition, flip chip method is effective for the case that the number of connections between a thin film circuit or an LED driver thin film circuit and a wiring is large, since a pitch between wirings can be relatively reserved large compared with wire bonding method.

A solder ball and a wiring over a device substrate can be connected by various methods such as thermo-compression bonding and thermo-compression bonding with vibrations from ultrasonic wave. An under fill may fill interspace of thermo-compressed solder balls between each other to improve the mechanical strength of connection portions or the efficiency of radiation of heat generated in a thin film circuit. An under fill is not always necessary to be used, but it can prevent poor connection due to stress occurred by mismatch of coefficient of thermal expansion of a device substrate and a semiconductor device. The compression by applying ultrasonic wave can prevent poor connection compared with compression without ultrasonic wave. Especially, it is effective for the case that the number of bumps used for connecting is at least approximately 300.

A wiring formed over a device substrate can be electrically connected to a thin film circuit or an LED driver thin film circuit in various forms by combining the ways described with reference to FIGS. 12A to 12C. In addition, a flip chip method and wire bonding method can be combined for connecting.

An active matrix liquid crystal display apparatus is explained in this embodiment though, a passive matrix liquid crystal display apparatus can be adopted in the invention.

According to above described structure of the invention, a liquid crystal display apparatus can be drastically reduced its thickness and weight without being damaged the mechanical strength. Applying a liquid crystal display apparatus according to the invention to an electronic appliance, a space for using IC can be kept large and an electronic appliance can be sophisticated without preventing the electronic appliance from being lightweight and downsized. Especially, a liquid crystal display apparatus according to the present invention is useful for a portable electronic appliance since usability thereof becomes improved by reducing the weight and the size. According to the invention, even when size of a pixel portion of a liquid crystal display apparatus is increased, weight thereof is almost the same as that of a liquid crystal display apparatus using a conventional glass substrate.

EXAMPLES

Hereinafter, examples of the present invention will be explained.

Example 1

The case that the present invention is applied to a card as typified by an electronic card will be explained in this example.

The configuration of an electronic card according to this example will be explained with reference to FIGS. 13A to 13D. FIG. 13A is a cross-sectional view showing a device substrate 401 at the time that a panel is completed. FIG. 13B is a top surface view of the device substrate illustrated in FIG. 13A. FIG. 13A shows the state that is taken along the line of A-A'.

The device substrate 401 illustrated in FIGS. 13A and 13B has a concave portion 402 in which an LED 403 or a plurality of those is formed. An LED driver thin film circuit 404 is provided to the concave portion 402. The LED 403 and the LED driver circuit are covered with a resin 407.

Reference numeral 415 denotes a panel, and 411 denotes a thin film circuit. The panel and the thin film circuit are formed separately and pasted onto the device substrate 401. The thin film circuit 411 has an antenna coil 406. A wiring 405 formed over the device substrate 401 is connected electrically to the antenna coil 406.

FIG. 13C is a cross-sectional view of a liquid crystal display apparatus according to the invention at the time of completing an electronic card. FIG. 13D is a top view showing a liquid crystal display apparatus illustrated in FIG. 13C. FIG. 13C is a cross-sectional view showing FIG. 13D taken along the line B-B'.

An electronic card as illustrated in FIGS. 13C and 13D is covered with a cover member 420 so as to seal the panel 415 and the thin film circuit 411 formed over the device substrate with a resin 422. In this embodiment, light emitted from the panel 415 is transmitted through a portion 421, but not exclusively, the cover member can be formed of a material that is transparent to light in order that light emitted from panel 415 also passes through the area except the portion 421.

In this embodiment, the structure of an electronic card that supplies signal or power supply voltage by electromagnetic introduction using an antenna coil is explained, however, the electronic card can have the structure that supplies signal or power supply voltage by light using a light-emitting device or light sensor. Further, the electronic card is not limited to a noncontact card. The electronic card may be a contact card that transmits directly signals to a terminal device via a terminal.

The electronic card can be used for various purposes such as a cash card, a credit card, a prepaid card, an ID card used for identification, and a commuter pass. If an electronic card is installed with the liquid crystal display apparatus according to the invention, data of the electronic card can be displayed on a pixel portion. Further, the reliability of certification of identity can be improved by displaying a photograph of a face. If a photograph of a face is used instead of a picture for identity, resolution of at least approximately QVGA (320× 240) is required.

Example 2

A method for manufacturing a plurality of liquid crystal display apparatus from a large sized device substrate will be explained with reference to FIGS. 14A and 14B.

Figure 14A:
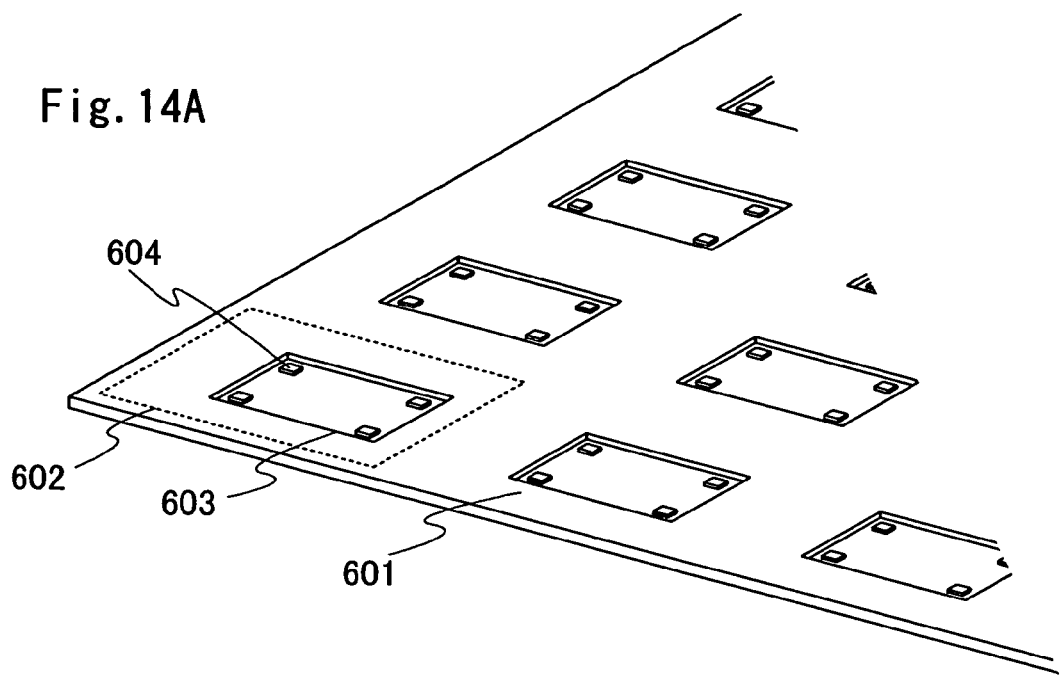
FIGS. 14A and 14B are oblique perspective views showing a large device substrate.
Figure 14B:
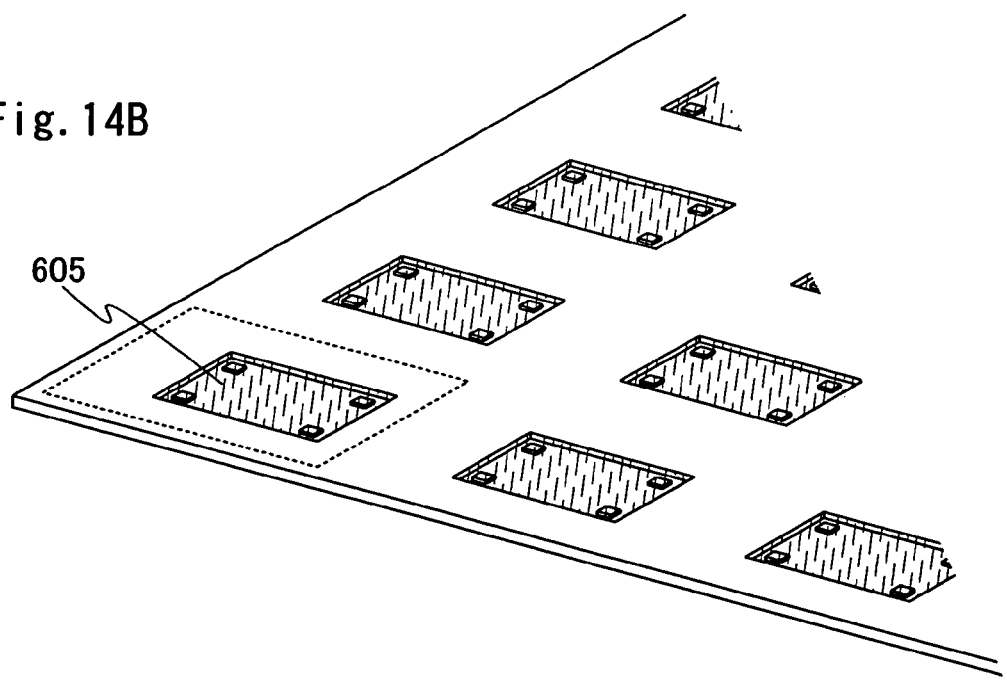

A shown in FIGS. 14A and 14B, in case of using a large sized device substrate 601, a plurality of concave portions 603 is formed in areas 602, each of which is corresponding to each liquid crystal display apparatus. LEDs 604 are provided in each concave portion 603. A wiring connected electrically to the LED 604, an LED driver thin film circuit, a reflection film, or the like (all are not shown) are provided with the LEDs, and a resin 605 is filled with each concave portion 603 as shown in FIG. 14B.

A panel or a thin film circuit is formed and diced in accordance with the method explained in the embodiment, and a plurality of liquid crystal display apparatus can be manufactured from one device substrate. The dicing can be carried out either before or after forming the panel or the thin film circuit.

Example 3

In this embodiment, the example that an LED is connected to a flexible printed wiring board (FPC) and the FPC is connected to a wiring over a device substrate, instead that the LED is directly connected to the wiring over a device substrate.

Figure 15A:
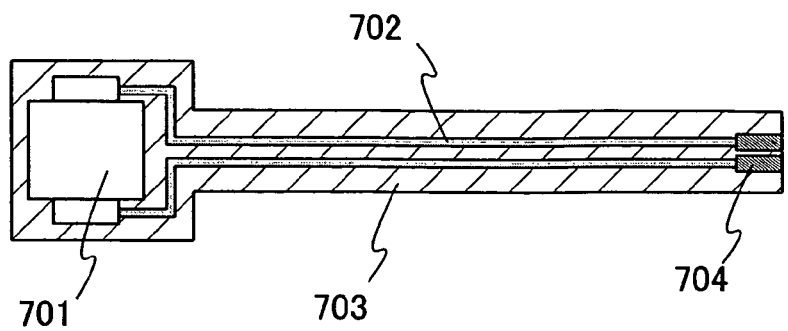
FIGS. 15A to 15D are views showing an LED utilizing an FPC and the state that the LED is pasted onto a device substrate.

FIG. 15A is a top surface view of an FPC connected with an LED. An LED 701 is connected to a lead 702 that is sandwiched by a plastic film 703. A terminal 704 connected with the lead 702 is not covered with the plastic film 703 and is exposed.

Figure 15B:
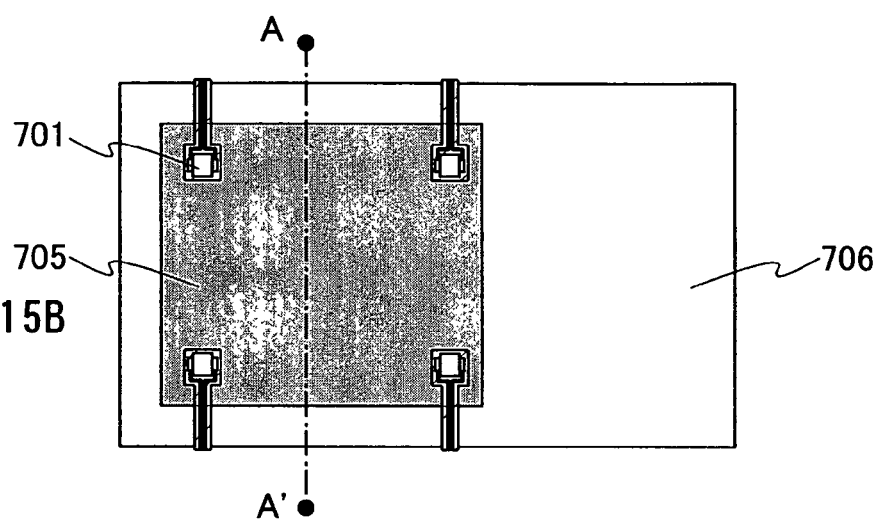
Figure 15C:
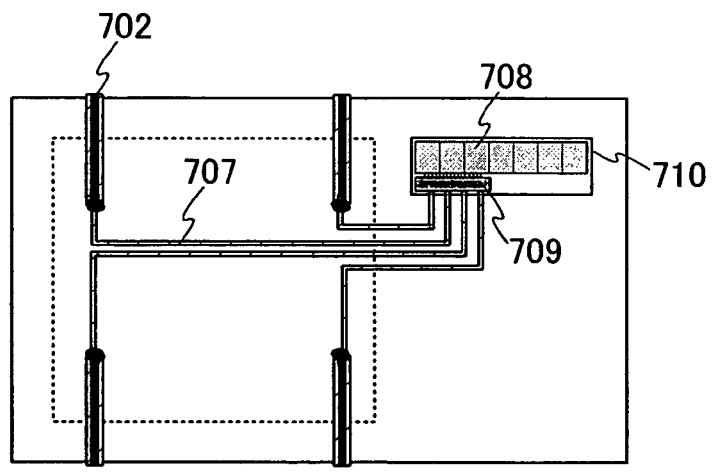

FIG. 15B is a view showing the state that the LED 701 illustrated in FIG. 15A is pasted onto a concave portion 705 in the device substrate 706. FIG. 15C is a view showing a reverse side of the device substrate 706 illustrated in FIG. 15B.

In the device substrate 706, a wiring 707 is provided with a reverse side of the concave portion 705. The LED 701 provided in the concave portion 705 and the wiring 707 are electrically connected each other by the lead 702.

The surface of the device substrate 706 provided with the wiring 707 has a concave portion 710. The regions provided with the concave portions 705, 710 are preferably not overlapped each other considering the intensity of the device substrate 706. A solar cell 708 and a driver circuit 709 for controlling the driving of the solar cell 708 are provided in the concave portion 710. The wiring 707 is electrically connected to the driver circuit 709.

According to the FPC, devices that are provided with both sides of the device substrate are electrically connected each other. Thus, the device substrate can be utilized without waste.

Figure 15D:
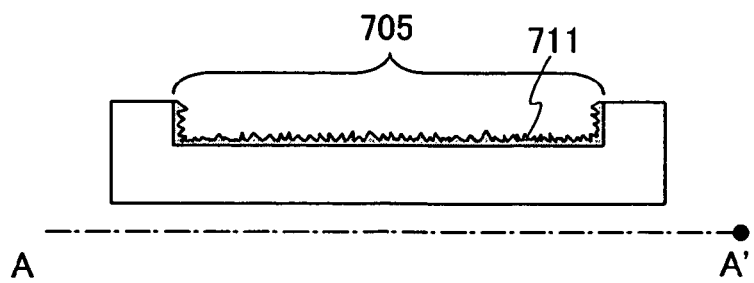

FIG. 15D is a cross-sectional view of the concave portion 705 taken along the dotted line A-A'. A metal reflection film 711 is deposited over the surface of the concave portion 711. According to this example, microscopic irregularities are formed on the surface of the reflection film 711 by corroding and by sandblasting using emery, and light emitted from the LED can be diffusely reflected and emitted evenly to the pixel portion.

Example 4

A method for forming a device substrate having a concave portion will be explained in this example.

Figure 16A:
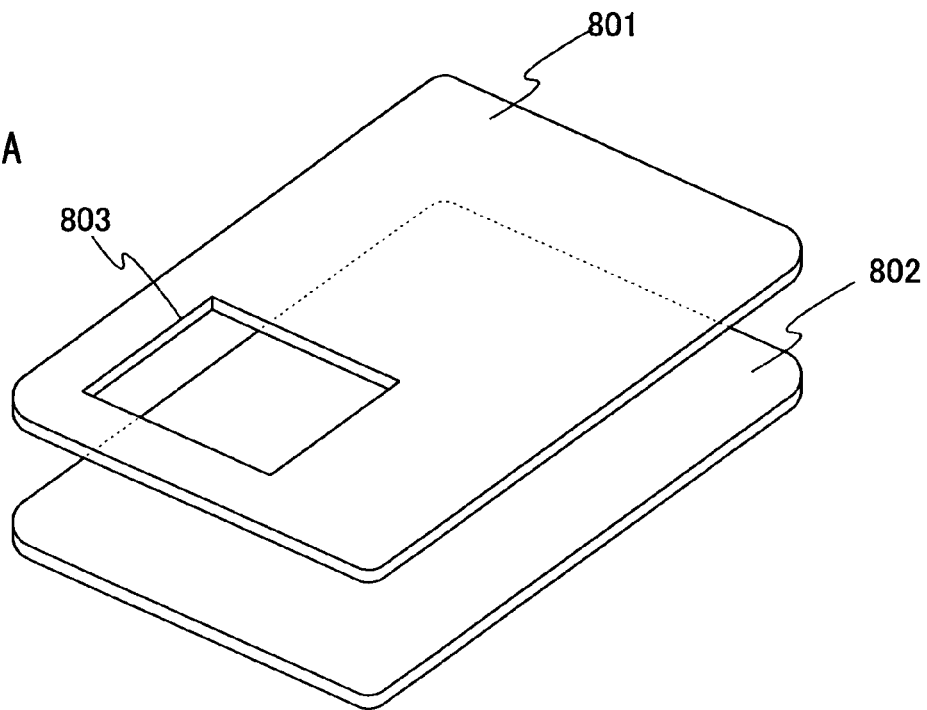
FIGS. 16A and 16B are views showing the structure of a device substrate.
Figure 16B:
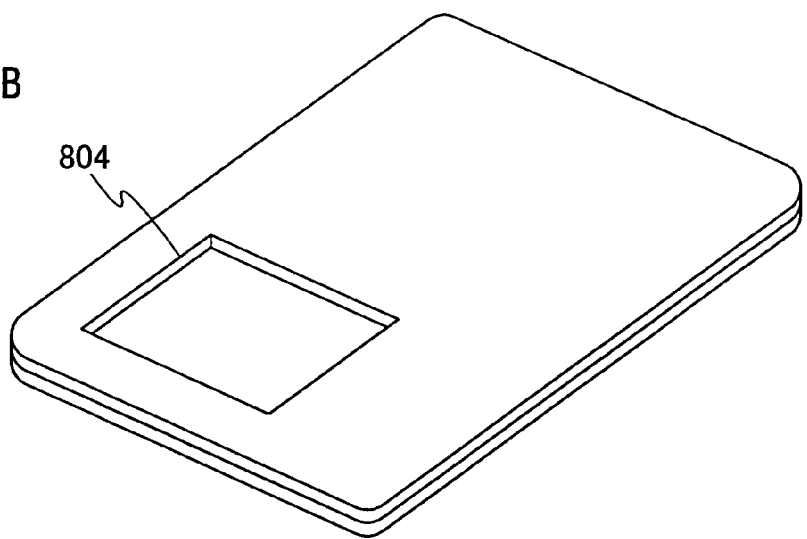

FIG. 16A is a view showing a plastic substrate 801 having an opening portion 803 and a plastic substrate 802 that is planarized. The plastic substrates 801 and 802 are pasted each other. Then, a device substrate 805 having a concave portion 804 is formed in the region where the opening portion 803 overlaps with the plastic substrate 802 that is planarized.

Example 5

An example that an area sensor is provided with an electronic card utilizing a liquid crystal display according to the present invention.

Figure 17A:
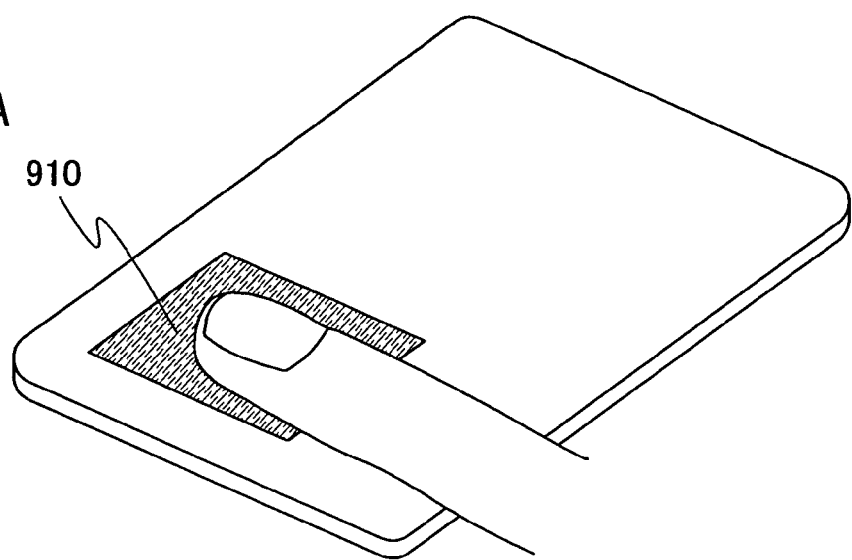
FIGS. 17A and 17B are an oblique perspective view and a cross-sectional view showing a sensor electronic card, respectively.
Figure 17B:
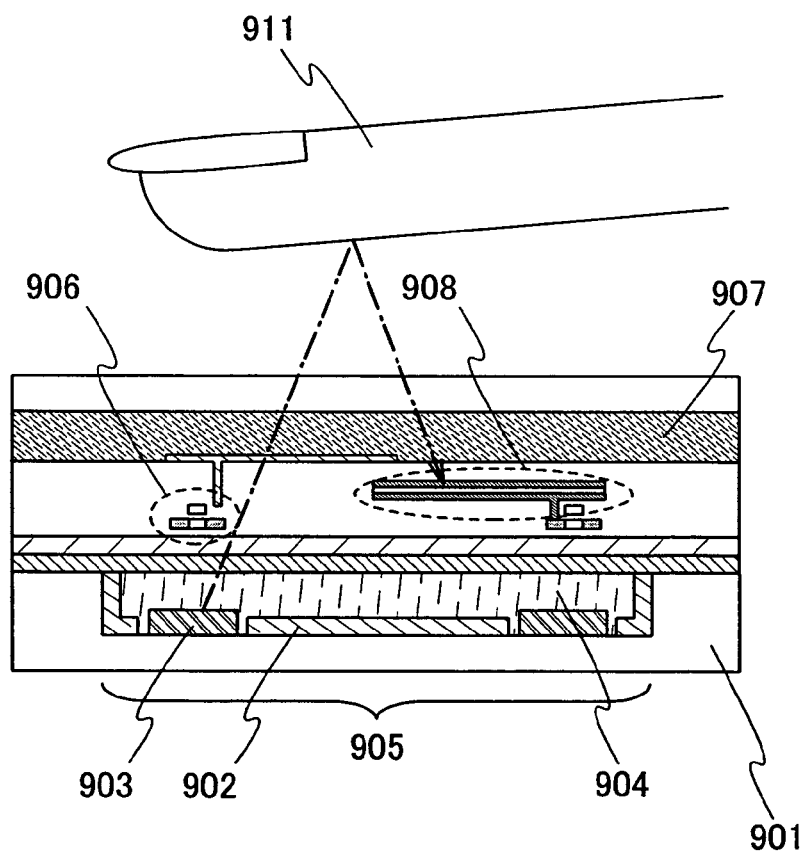

FIG. 17A is a view showing that a tip of a finger presses a pixel portion 910 that serves not only as an image display portion but also as an area sensor. FIG. 17B is a view showing a cross-sectional view of the pixel portion 910 illustrated in FIG. 17A.

As shown in FIG. 17B, a device substrate 901 is formed to have a concave portion 905. A reflection film 902 is formed over the surface of the concave portion 905. An LED 903 is provided in the concave portion 905 and covered with a resin 904.

A TFT 906 for applying voltage to a liquid crystal 907 and a photo diode 908 are provided over the device substrate 901. The TFT 906 and the photo diode 908 are separately formed over different substrates, and separated to paste onto the device substrate 901.

Light emitted from the LED 903 is reflected by a finger 911 that serves as a subject, and radiated to the photo diode 908. Then, image data of the finger 911 can be obtained.

Example 6

A liquid crystal display apparatus according to the present invention can be utilized for various electronic appliances. Especially, it is effective to use the liquid crystal display apparatus for portable type electronic appliances since the usability thereof is drastically improved by reducing the weight or the size.

FIG. 18A is a view showing a sheet-shaped cellular phone comprising a main body 2101, a display unit 2103, a sound input unit 2104, a sound output unit 2105, a switch 2106, an external connection port 2107, or the like. An earphone 2108 prepared separately can be connected to the cellular phone via the external connection port 2107. A touch panel liquid crystal display apparatus having a sensor according to the present invention is used for the display unit 2103. A continuous stream of operation can be carried out by touching a touch panel operation key 2109 displayed on the display unit 2103. A thin film circuit provided with the liquid crystal display apparatus according to the invention can be used as various signal processing circuits provided in the main body 2101.

FIG. 18B is a view showing an electronic book comprising a main body 2201, a display unit 2202, an operation key 2203, and the like. The main body 2201 can have a built-in modem. A liquid crystal display apparatus having a sensor according to the present invention is used for the display unit 2202. A thin film circuit provided with the liquid crystal display apparatus according to the invention can be used as various signal processing circuits.

FIG. 18C is a view showing a wrist watch comprising 2301, a display unit 2302, a fastening 2303, and the like. A liquid crystal display apparatus having a sensor according to the present invention is used for the display unit 2302. A thin film circuit provided with the liquid crystal display apparatus according to the invention can be used as various signal processing circuits provided in the main body 2301.

FIG. 18D is a view showing a personal computer comprising a main body 2401, a display unit 2402, a touch panel key board 2403, a mouse 2404, an external connection port 2405, a power source plug 2406, and the like. A liquid crystal display apparatus having a sensor according to the present invention is used for the display unit 2402. A touch panel liquid crystal display apparatus having a sensor according to the present invention is used for the touch panel keyboard 2403 and the mouse 2404. A continuous stream of operation can be carried out by touching the touch panel key board 2403 and the mouse 2404. A thin film circuit provided with the liquid crystal display apparatus according to the invention can be used as various signal processing circuits.

FIG. 18E is a view showing a front glass viewing from the inside of a car. A front glass 2501 is pasted with a liquid crystal display apparatus 2503 according to the present invention. A display unit 2502 can display various pieces of information required by a driver. In FIG. 18E, an example that the liquid crystal display apparatus according to the invention is pasted onto the front glass is explained, but the liquid crystal display apparatus can be pasted onto a window glass of side and back of a driver's seat. Further, the liquid crystal display apparatus can be pasted onto either inside or outside of a car.

FIG. 18F is a view showing an electronic card comprising a main body 2601, a display unit 2602, a connection terminal 2603, and the like. The pixel portion of the liquid crystal display apparatus according to the invention can be utilized as the display unit 2602. A thin film circuit provided with the liquid crystal display apparatus according to the invention can be used as various signal processing circuits provide in the main body 2601.

Therefore the applicable range of the invention is extremely large, and the invention can be utilized for electronic appliances in various fields. The electronic appliances described in this embodiment can use any structure of liquid crystal structures described in Embodiments 1 to 5.

Example 7

A measurement result of a first substrate side after separating and a cross-section of an insulating film side by TEM will be described in this example.

Figure 19A:
FIGS. 19A and 19B are cross sections of TEM images of a metal oxide film before separating.
Figure 19B:
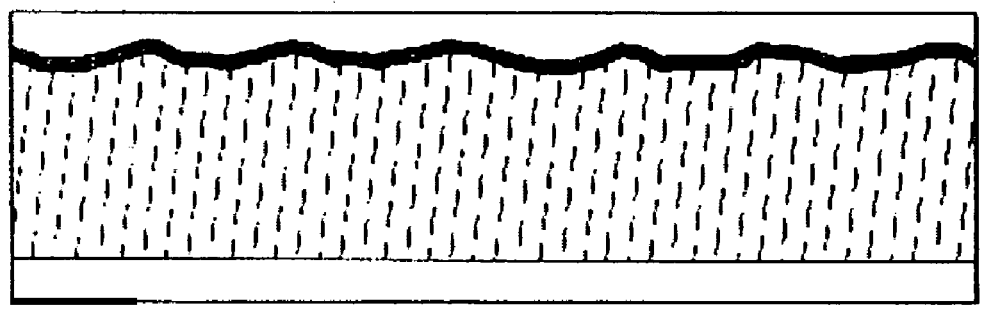
Figure 20A:
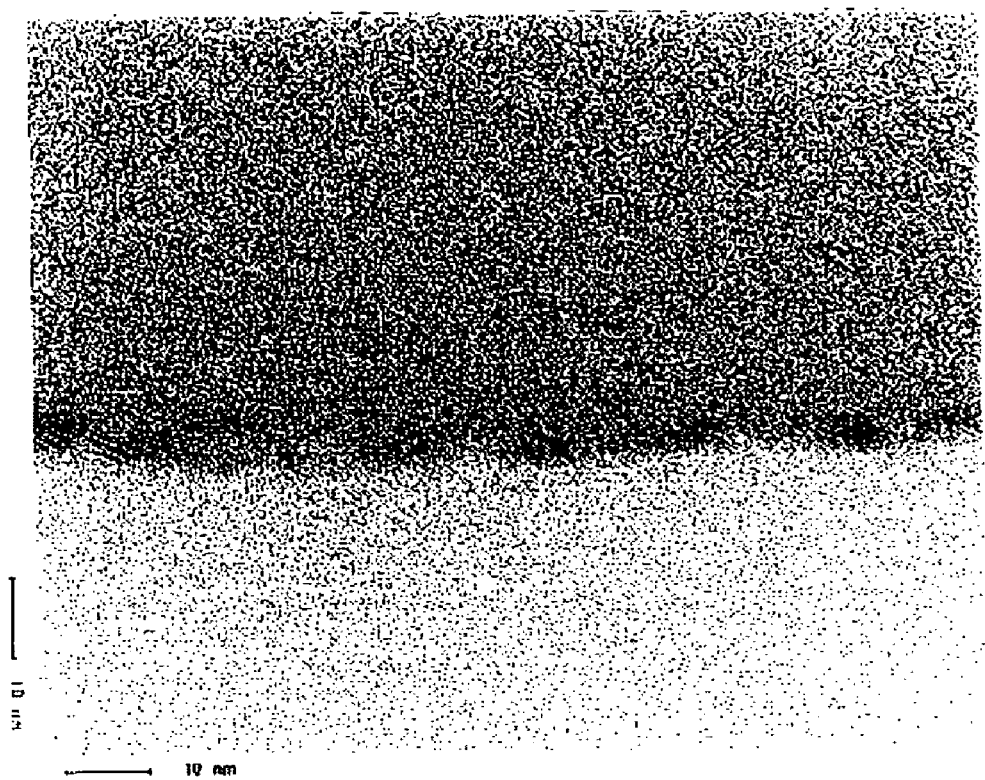
FIGS. 20A and 20B are cross sections of TEM images of an insulating film after separating.
Figure 20B:
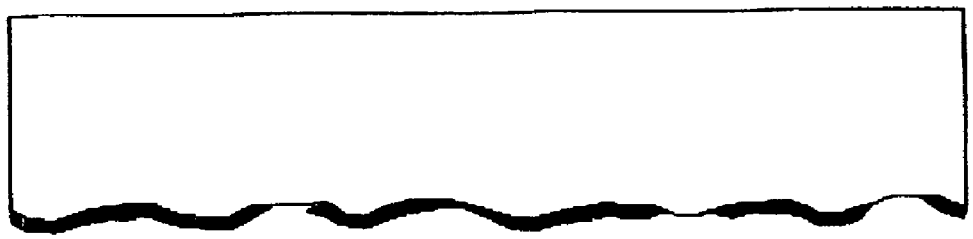

On a glass substrate, a W film is deposited to have a thickness of 50 nm by sputtering, a silicon oxide film is deposited to have a thickness of 200 nm by sputtering, a silicon oxynitride film is deposited to have a thickness of 100 nm by PCVD, an amorphous silicon film is deposited by PCVD to have a thickness of 50 nm as a semiconductor film, sequentially. Thereafter, the resulted film is heat-treated at 500° C.

for 1 hour, further, at 550° C. for 4 hours, then, separated by a physical means such as polytetrafluoroethylene tape. FIG. 19 is a TEM photograph showing the W film and an oxide layer at the substrate side. FIG. 20 is a TEM photograph showing an oxide layer and a silicon oxide film at the semiconductor film side.

As shown in FIG. 19, a metal oxide film is inhomogeneously remained in contact with a metal film. As shown in FIG. 20, a metal oxide film is also inhomogeneously remained in contact with a metal film. According to both the TEM photographs, the facts are proved that the metal oxide film is split off by or separated at boundary faces of both sides, and that the metal oxide film is remained inhomogeneously adhered to the metal film and the silicon oxide film.

Therefore a quantity of the metal oxide film is attached to the device substrate side of the insulating film in the liquid crystal display apparatus according to the present invention.

Example 8

A liquid crystal material used for separating a first substrate after completing a liquid crystal display apparatus will be explained in this example.

FIGS. 21A and 21B are cross-sectional views showing a liquid crystal display apparatus according to this example. The liquid crystal display apparatus illustrated in FIG. 21A is provided with a columnar shaped spacer 1401 in a pixel to enhance the adhesiveness of a counter substrate 1402 and a polarizing plate 1403 at a device side. According to this, a semiconductor device except that in the region that is overlapped with a sealing member at the separation of the first substrate can be prevented from remaining at the first substrate side.

FIG. 21B a cross-sectional view showing a liquid crystal display apparatus utilizing a nematic liquid crystal, smectic liquid crystal, ferroelectric liquid crystal or PDLS (polymer dispersed liquid crystal) containing these liquid crystals in polymer resin. The adhesiveness of the counter substrate 1402 and the polarizing plate 1403 at a device side are enhanced, and a semiconductor device except that in the region that is overlapped with a sealing member at the separation of the first substrate can be prevented from remaining at the first substrate side by using PDLC 1404.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A liquid crystal display apparatus comprising:
   a liquid crystal device having a pixel portion comprising:
      an insulating film;
      a plurality of switching elements formed over the insulating film;
      a plurality of electrodes electrically connected to the plurality of switching elements;
      a liquid crystal material adjacent to the plurality of electrodes; and
      a counter substrate opposed to the plurality of electrodes with the liquid crystal material interposed therebetween;
   a back light unit comprising:
      a plastic substrate;
      a plurality of light emitting elements formed over the plastic substrate; and
      a resin covering the plurality of light emitting elements, and
   a polarizing plate disposed between the liquid crystal device and the back light unit, the polarizing plate being attached to the insulating film by an adhesive wherein the insulating film is in direct contact with the adhesive,
   wherein the polarizing plate is directly attached to the back light unit, and
   wherein the plastic substrate covers an entirety of the pixel portion.

2. A liquid crystal display apparatus comprising:
   a liquid crystal device having a pixel portion comprising:
      an insulating film;
      a plurality of switching elements formed over the insulating film;
      a plurality of electrodes electrically connected to the plurality of switching elements;
      a liquid crystal material adjacent to the plurality of electrodes; and
      a counter substrate opposed to the plurality of electrodes with the liquid crystal material interposed therebetween;
   a back light unit comprising:
      a plastic substrate;
      a metal film formed over the plastic substrate;
      a plurality of light emitting elements formed over the plastic substrate; and
      a resin covering the plurality of light emitting elements, and
   a polarizing plate disposed between the liquid crystal device and the back light unit, the polarizing plate being attached to the insulating film by an adhesive wherein the insulating film is in direct contact with the adhesive,
   wherein the polarizing plate is directly attached to the back light unit, and
   wherein the plastic substrate covers an entirety of the pixel portion.

3. A liquid crystal display apparatus according to claim 2, wherein the metal film is sand blasted.

4. A liquid crystal display apparatus according to any one of claims 1 and 2, wherein a liquid crystal cell comprising a counter electrode, the liquid crystal material, and one of the plurality of electrodes is transparent to light.

5. A liquid crystal display apparatus according to claim 1, wherein the light-emitting device is a light-emitting diode.

6. A liquid crystal display apparatus according to claim 5, wherein the light-emitting diode is connected to an FPC and supplied with current via the FPC.

7. A liquid crystal display apparatus according to claim 2, wherein the light-emitting device is a light-emitting diode.

8. A liquid crystal display apparatus according to claim 7, wherein the light-emitting diode is connected to an FPC and supplied with current via the FPC.

9. A liquid crystal display apparatus according to any one of claims 1 and 2, wherein the liquid crystal display apparatus is incorporated in a cellular phone.

10. A liquid crystal display apparatus according to any one of claims 1 and 2, wherein the liquid crystal display apparatus is incorporated in an electronic book.

11. A liquid crystal display apparatus according to any one of claims 1 and 2, wherein the liquid crystal display apparatus is incorporated in a wrist watch.

12. A liquid crystal display apparatus according to any one of claims 1 and 2, wherein the liquid crystal display apparatus is incorporated in a personal computer.

13. A liquid crystal display apparatus according to any one of claims 1 and 2, wherein the liquid crystal display apparatus is incorporated in a front glass.

14. A liquid crystal display apparatus according to any one of claims 1 and 2, wherein the liquid crystal display apparatus is incorporated in an electronic card.

15. A liquid crystal display apparatus according to claim 1, wherein the resin comprises a transparent particle.

16. A liquid crystal display apparatus according to claim 2, wherein the resin comprises a transparent particle.

17. A liquid crystal display apparatus according to claim 1, wherein the light-emitting device includes a pair of electrodes.

18. A liquid crystal display apparatus according to claim 2, wherein the light-emitting device includes a pair of electrodes.

19. A liquid crystal display apparatus according to any one of claims 1 and 2, wherein the plastic substrate is larger than the counter substrate.

* * * * *